(12) United States Patent
Tan

(10) Patent No.: US 11,218,138 B1
(45) Date of Patent: Jan. 4, 2022

(54) MULTI-INTERVAL SENSING CIRCUIT AND SENSING METHOD HAVING MULTI-HYSTERESIS

(71) Applicant: PixArt Imaging (Penang) SDN. BHD., Penang (MY)

(72) Inventor: Kok-Siang Tan, Penang (MY)

(73) Assignee: PIXART IMAGING (PENANG) SDN. BHD., Penang (MY)

( * ) Notice: Subject to any disclaimer, the term of this patent is extended or adjusted under 35 U.S.C. 154(b) by 0 days.

(21) Appl. No.: 17/232,101

(22) Filed: Apr. 15, 2021

(51) Int. Cl.
   *H03K 3/00* (2006.01)
   *H03K 3/3565* (2006.01)
   *H03K 3/0233* (2006.01)
   *H03K 3/037* (2006.01)

(52) U.S. Cl.
   CPC ....... *H03K 3/3565* (2013.01); *H03K 3/02337* (2013.01); *H03K 3/0377* (2013.01)

(58) Field of Classification Search
   None
   See application file for complete search history.

(56) References Cited

U.S. PATENT DOCUMENTS

| | | | | |
|---|---|---|---|---|
| 5,155,386 A * | 10/1992 | Abdi | ................. | H03K 3/02337 327/67 |
| 5,666,075 A * | 9/1997 | Schinzel | ............ | H03K 3/02337 327/205 |
| 5,736,826 A * | 4/1998 | Hrassky | .................... | H02P 7/04 318/635 |
| 2008/0048746 A1* | 2/2008 | Raman | ................. | H03K 3/0377 327/205 |
| 2008/0074162 A1* | 3/2008 | Hsu | ........................ | H03K 5/135 327/205 |
| 2011/0285376 A1* | 11/2011 | Horio | ................... | H03K 3/3565 323/299 |

* cited by examiner

*Primary Examiner* — Tuan T Lam
(74) *Attorney, Agent, or Firm* — Tung & Associates

(57) ABSTRACT

A sensing circuit includes: a comparison circuit for comparing an input signal to a corresponding limit threshold; and a control circuit for periodically selecting the limit threshold and sampling a comparison result to execute an interval determination step, thus determining an interval of the input signal. The interval determination step includes steps S100 and S200. Step S100: when the input signal is higher than an ascending upper limit threshold for consecutive plural times, assigning a higher adjacent interval as a following interval; when the input signal is lower than a descending lower limit threshold for consecutive plural times, assigning a lower adjacent interval as a following interval; and executing the interval determination step corresponding to the following interval. Step S200: When no adjacent interval is assigned as the following interval, generating an interval output signal corresponding to the interval and entering the corresponding step S100.

19 Claims, 15 Drawing Sheets mYes: CPO consecutive m times of "Yes"
mNo: CPD consecutive m times of "No"

MULTI-INTERVAL SENSING CIRCUIT AND SENSING METHOD HAVING MULTI-HYSTERESIS

BACKGROUND OF THE INVENTION

Field of Invention

The present invention relates to a sensing circuit having hysteresis; particularly, it relates to a multi-interval sensing circuit having multi-hysteresis. The present invention also relates to a multi-interval sensing method having multi-hysteresis.

Description of Related Art

FIG. 1A shows a conventional hysteresis sensing circuit (i.e., conventional Schmitt trigger comparator 1001) and illustrates a waveform diagram depicting the time-domain operation of the conventional hysteresis sensing circuit. Because the Schmitt trigger comparator 1001 has a threshold voltage Vth having a hysteresis voltage Vhys, the Schmitt trigger comparator 1001 can sense a level of an input signal Vin to determine whether the input signal Vin is within a high interval or within a low interval, and can filter out noise of the input signal Vin at the same time shown in FIG. 1A, thus obtaining a stable output voltage Vout representing the high interval or the low interval the input signal Vin is determined to be within. Please refer to FIG. 1B, which shows a characteristic curve between the output signal Vout and the input signal Vin corresponding to FIG. 1A. The output signal Vout has two different characteristics, depending upon whether the input signal yin is ascending or descending. The hysteresis voltage Vhys lies between two different characteristic curves (i.e., one characteristic curve of the output signal Vout in a case where the input signal Vin is ascending, and the other characteristic curve of the output signal Vout in a case where the input signal Vin is descending).

Please refer to FIG. 2, which shows a circuit diagram of a typical Schmitt trigger comparator (i.e. hysteresis sensing circuit 1002). The hysteresis sensing circuit 1002 can achieve inverting function with hysteresis by integrating an inverter with positive feedback devices.

Please refer to FIG. 3, which shows another conventional sensing circuit (i.e. hysteresis sensing circuit 1003). The hysteresis sensing circuit 1003 is configured as a positive feedback type operational amplification circuit for use as a comparator with hysteresis. A reference signal Vref and feedback resistors together determine a hysteresis voltage Vhys.

The prior art hysteresis sensing circuits shown in FIG. 1A, FIG. 1B, FIG. 2 and FIG. 3 have the following drawbacks: these prior art hysteresis sensing circuits simply have only one threshold for determining an interval with only one hysteresis voltage. Besides, it is not easy for these prior art hysteresis sensing circuits to flexibly set a threshold and a hysteresis voltage.

As compared to the prior art hysteresis sensing circuits shown in FIG. 1A, FIG. 1B, FIG. 2 and FIG. 3, the present invention is advantageous in that: the present invention can have multi-hysteresis and plural thresholds. In addition, it is feasible for the present invention to flexibly set levels of the thresholds and the hysteresis level of the sensing circuit.

SUMMARY OF THE INVENTION

From one perspective, the present invention provides a multi-interval sensing circuit, which is configured to operably sense an input signal, so as to determine an interval, among plural intervals with hysteresis, according to a level of the input signal, wherein each of the plural interval has corresponding plural limit thresholds and a corresponding hysteresis level, wherein the plural limit thresholds include: a corresponding ascending upper limit threshold and a corresponding descending lower limit threshold; the multi-interval sensing circuit comprising: a comparison circuit, which is configured to operably generate a comparison result according to a comparison between the input signal and the corresponding limit threshold; and a control circuit, which is configured to operably adjust the limit threshold and sample the comparison result based on a sampling frequency, so as to execute an interval determination step, thus generating an interval output signal, wherein the interval output signal is indicative of the corresponding interval of the input signal, wherein the corresponding limit threshold is generated according to a limit threshold required for the interval determination step, wherein the interval determination step includes a step S100 and a step S200, wherein: the step S100 includes: a step S110: before a first time out period expires, when the input signal is higher than the corresponding ascending upper limit threshold for consecutive plural times, assigning an adjacent interval which is relatively higher as a following interval and executing the interval determination step corresponding to the following interval; and a step S120: before a second time out period expires, when the input signal is lower than the corresponding descending lower limit threshold for consecutive plural times, assigning an adjacent interval which is relatively lower as a following interval and executing the interval determination step corresponding to the following interval; wherein when neither of the step S110 and the step S120 assigns an adjacent interval as a following interval, executing the corresponding step S200; and the step S200 includes: generating an interval output signal corresponding to the interval, and, subsequently, entering the step S100 corresponding to the interval.

In one embodiment, the step S110 further includes a step S114: determining whether the input signal is lower than the corresponding ascending upper limit threshold for the consecutive plural times before the first time out period expires; and the step S120 further includes a step S124: determining whether the input signal is higher than the corresponding descending lower limit threshold for the consecutive plural times before the second time out period expires; wherein when neither of the step S110 and the step S120 assigns an adjacent interval as a following interval and when the following criteria are satisfied, executing the corresponding step S200: when the first time out period has expired or the step S114 is determined "yes", and, when the second time out period has expired or the step S124 is determined "yes".

In one embodiment, the interval determination step corresponding to the following interval is executed according to the following step sequences: the step S200, followed by the step S100; or the step S100, followed by the step S200.

In one embodiment, the hysteresis level is equal to a range corresponding to the interval.

In one embodiment, when the corresponding interval is a highest interval, the corresponding step S110 is be skipped; and when the corresponding interval is a lowest interval, the corresponding step S120 is skipped.

In one embodiment, the input signal is in a voltage form.

In one embodiment, the control circuit includes: a digital filter circuit and an interval determination circuit; wherein: the digital filter circuit includes: corresponding plural state logic circuits which are cascaded to sequentially sample and transfer the comparison result based on the sampling frequency, wherein corresponding plural state output signals of the corresponding plural state logic circuits correspond to the consecutive plural times of samplings of the comparison result; and the interval determination circuit is configured to operably execute the interval determination step according to whether levels of the consecutive plural times of the samplings of the comparison result are consistent and/or whether a corresponding timed out period has expired.

In one embodiment, the digital filter circuit further includes: an AND logic circuit having corresponding plural input terminals, which is configured to operably receive the state output signals of the corresponding plural state logic circuits, so as to determine whether the state output signals are all at an enabled state, thereby enabling a filtered positive signal; wherein the interval determination circuit is configured to operably execute following operations: the step S110 includes: when the filtered positive signal is enabled before the first time out period expires, which indicates that the input signal is higher than the corresponding ascending upper limit threshold for the consecutive plural times, assigning an adjacent interval which is relatively higher as the following interval; the step S120 includes: when the filtered positive signal is enabled before the second time out period expires, which indicates that the input signal is lower than the corresponding descending lower limit threshold for the consecutive plural times, assigning an adjacent interval which is relatively lower as the following interval; and wherein when neither of the corresponding filtered positive signals in the step S110 and the step S120 is enabled before the corresponding first time out period or the corresponding second time out period expires, executing the corresponding step S200.

In one embodiment, the digital filter circuit further includes: another AND logic circuit having corresponding plural input terminals, which is configured to operably receive the state output signals of the corresponding plural state logic circuits, so as to determine whether the state output signals are all at a disabled state, thereby enabling a filtered negative signal; wherein the interval determination circuit is configured to operably execute following operations: the step S114 includes: determining whether the input signal is lower than the corresponding ascending upper limit threshold for the consecutive plural times before the first time out period expires according to whether the filtered negative signal is enabled before the first time out period expires; and the step S124 includes: determining whether the input signal is higher than the corresponding descending lower limit threshold for the consecutive plural times before the second time out period expires according to whether the filtered negative signal is enabled before the second time out period expires.

In one embodiment, the comparison circuit includes: a comparator, configured to operably compare a reference signal with an input related signal which is correlated with the input signal, so as to generate the comparison result; the control circuit further includes: an adjustment circuit, which is configured to operably generate a corresponding adjustment signal according to the corresponding limit threshold, wherein the adjustment signal adjusts the reference signal or the input related signal, so that a comparison between the reference signal and the input related signal corresponds to a comparison between the input signal and the corresponding limit threshold.

In one embodiment, the interval determination circuit is further configured for timing the first time out period and/or the second time out period.

In one embodiment, the interval determination step further comprises a reset step S000, wherein the reset step S000 includes: resetting the interval output signal; and executing the step S100 corresponding to an initial interval.

From another perspective, the present invention provides a multi-interval sensing method having multi-hysteresis, which is configured to operably sense an input signal, so as to determine an interval, among plural intervals with hysteresis, according to a level of the input signal, wherein each of the plural intervals has corresponding plural limit thresholds and a corresponding hysteresis level, wherein the plural limit thresholds includes: a corresponding ascending upper limit threshold and a corresponding descending lower limit threshold; the multi-interval sensing method comprising: generating a comparison result according to a comparison between the input signal and the corresponding limit threshold; and adjusting the limit threshold and sampling the comparison result based on a sampling frequency, so as to execute an interval determination step, thus generating an interval output signal, wherein the interval output signal is indicative of the corresponding interval of the input signal, wherein the interval determination step includes a step S100 and a step S200, wherein the corresponding limit threshold is generated according to a limit threshold required for the interval determination step, wherein the interval determination step includes a step S100 and a step S200, wherein: the step S100 includes: a step S110: before a first time out period expires, when the input signal is higher than the corresponding ascending upper limit threshold for consecutive plural times, assigning an adjacent interval which is relatively higher as a following interval and executing the interval determination step corresponding to the following interval; a step S120: before a second time out period expires, when the input signal is lower than the corresponding descending lower limit threshold for consecutive plural times, assigning an adjacent interval which is relatively lower as a following interval and executing the interval determination step corresponding to the following interval; wherein when neither of the step S110 and the step S120 assigns an adjacent interval as a following interval, executing the corresponding step S200; and the step S200 includes: generating an interval output signal corresponding to the interval, and, subsequently, entering into the step S100 corresponding to the interval.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1A:
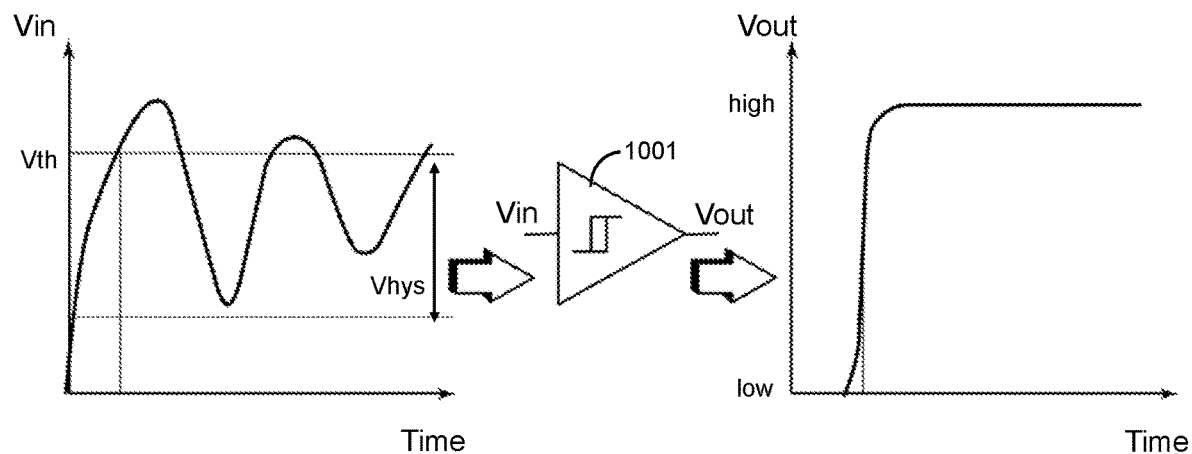
FIG. 1A shows a conventional hysteresis sensing circuit and illustrates a waveform diagram depicting the time-domain operation of the conventional hysteresis sensing circuit.
Figure 1B:
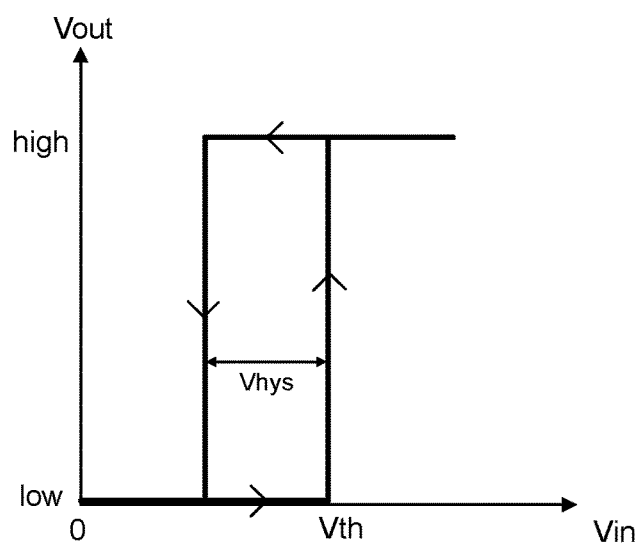
FIG. 1B shows a characteristic curve between an output signal and an input signal corresponding to FIG. 1A.
Figure 2:
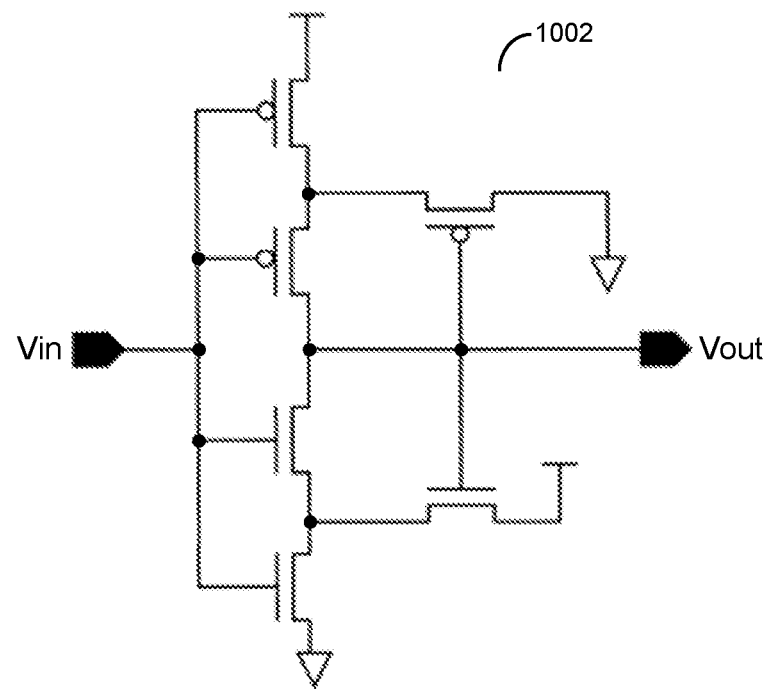
FIG. 2 and FIG. 3 show two conventional hysteresis sensing circuits, respectively.
Figure 3:
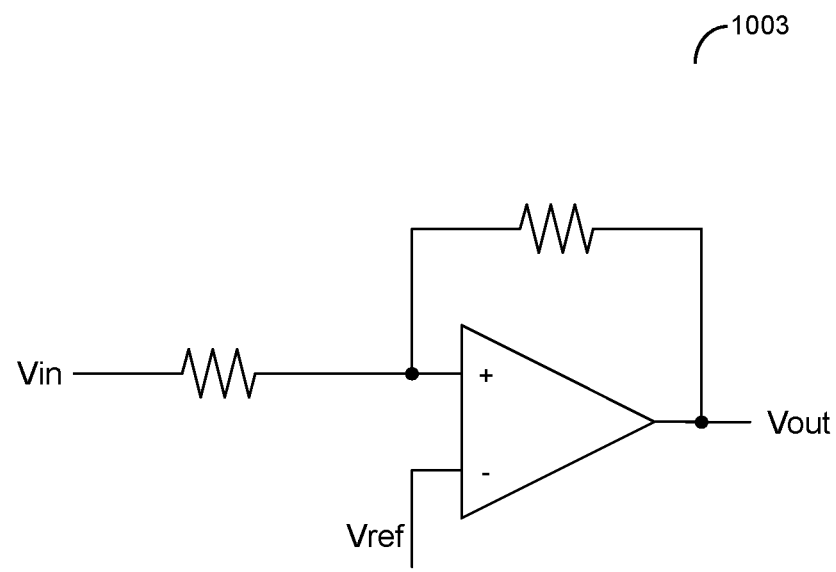
Figure 4:
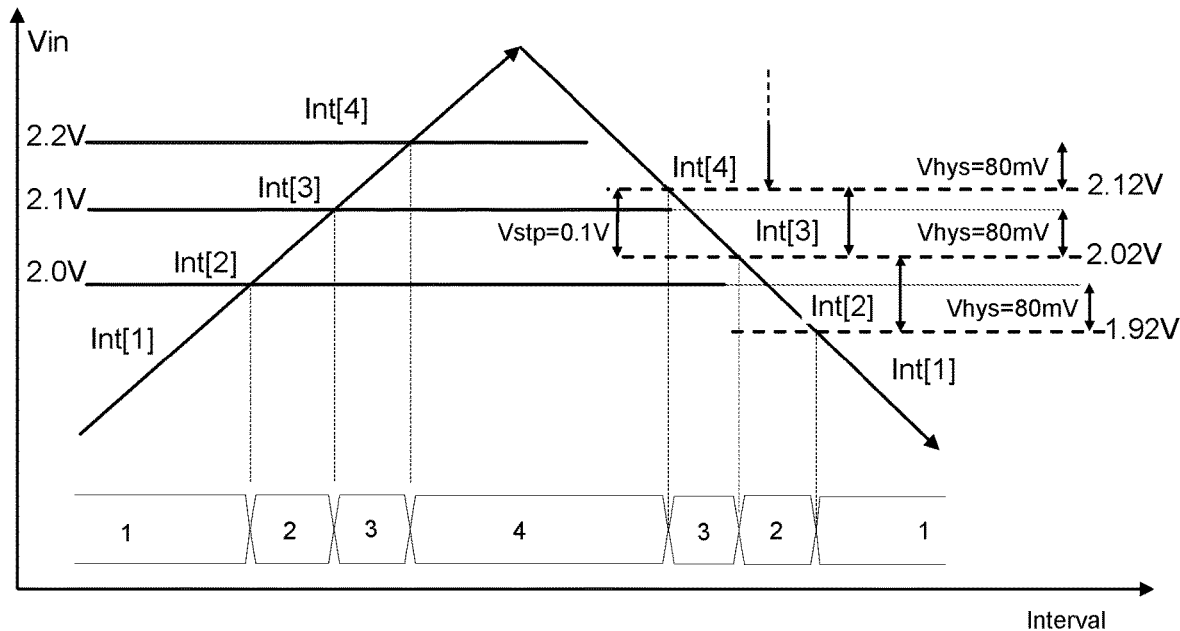
FIG. 4 shows a characteristic curve corresponding to a sensing circuit according to an embodiment of the present invention.

Please refer to FIG. 4, which shows a characteristic curve corresponding to a sensing circuit according to an embodiment of the present invention. As shown in FIG. 4, the sensing circuit of the present invention has multiple thresholds and corresponding multiple intervals. The sensing circuit can determine which interval the input signal Vin is mapped to according to the thresholds. Besides, the sensing circuit of the present invention has multiple hysteresis in correspondence with the multiple thresholds. To elaborate in more detail, each interval Int[k] (i.e., Int[k]) has plural corresponding limit thresholds and a corresponding hysteresis level. Each limit threshold includes: a corresponding ascending upper limit threshold Vthuu[k], a corresponding ascending lower limit threshold Vthul[k], a corresponding descending upper limit threshold Vthdu[k] and a corresponding descending lower limit threshold Vthdl[k]. Note that the aforementioned "k" is a positive integer from 1 to N, wherein N indicates a predetermined total number of intervals corresponding to the input voltage Vin and is a positive integer greater than 1.

When the input signal Vin is ascending, it is determined according to the ascending upper limit threshold Vthuu[k] that whether the corresponding interval of the input signal Vin should be re-assigned from the interval Int[k] to an adjacent higher interval Int [k+1], and, it is determined according to the ascending lower limit threshold Vthul[k] that whether the corresponding interval of the input signal Vin should be re-assigned from an adjacent lower interval Int[k−1] to the interval Int[k]. In one embodiment, the ascending upper limit threshold Vthuu[k] of the interval Int[k] is equal to the ascending lower limit threshold Vthul [k+1] of the interval Int[k+1], and, the ascending lower limit threshold Vthul [k] of the interval Int[k] is equal to the ascending upper limit threshold Vthuu[k−1] of the interval Int[k−1].

On the other hand, when the input signal Vin is descending, it is determined according to the descending lower limit threshold Vthdl[k] that whether the corresponding interval of the input signal Vin should be re-assigned from the interval Int[k] to an adjacent lower interval Int[k−1], and, it is determined according to the descending upper limit threshold Vthdu[k] whether the corresponding interval of the input signal Vin should be re-assigned from the adjacent higher interval Int[k+1] to the interval Int[k]. In one embodiment, the descending lower limit threshold Vthdl[k] of the interval Int[k] is equal to the descending upper limit threshold Vthdu[k−1] of the interval Int[k−1], and, the descending upper limit threshold Vthdu[k] of the interval Int [k] is equal to the descending lower limit threshold Vthdl[k+1] of the interval Int[k+1].

To be more specific, as an example, an interval Int[3] shown in FIG. 4 has corresponding limit thresholds, which include: an ascending upper limit threshold Vthuu[3] of 2.2V, an ascending lower limit threshold Vthul[3] of 2.1V, a descending upper limit threshold Vthdu[3] of 2.12V and a descending lower limit threshold Vthdl[3] of 2.02V. In this embodiment, each interval has a range Vstp of 0.1V (in one embodiment, not including the highest and the lowest intervals). In other words, a difference between the ascending upper limit threshold Vthuu[3] and the ascending lower limit threshold Vthul[3] is equal to 0.1V (i.e., 2.2V−2.1V=0.1V), or, a difference between the descending upper limit threshold Vthdu[3] and the descending lower limit threshold Vthdl[3] is equal to 0.1V (i.e., 2.12V−2.02V=0.1V). Note that in one embodiment, the range of the highest and the lowest intervals can also be 0.1V. In other embodiments, the range of the highest and the lowest intervals can be other values which relate to the highest and lowest possible levels of the input signal Vin.

A hysteresis level Vhys is equal to 80 mV in this embodiment. In other words, a difference between the ascending upper limit threshold Vthuu[3] and the descending upper limit threshold Vthdu[3] is equal to 80 mV (i.e., 2.2V−2.12V=0.08V), or, a difference between the ascending lower limit threshold Vthul[3] and the descending lower limit threshold Vthdl[3] is equal to 80 mV (i.e., 2.1V−2.02V=0.08V).

Figure 5:
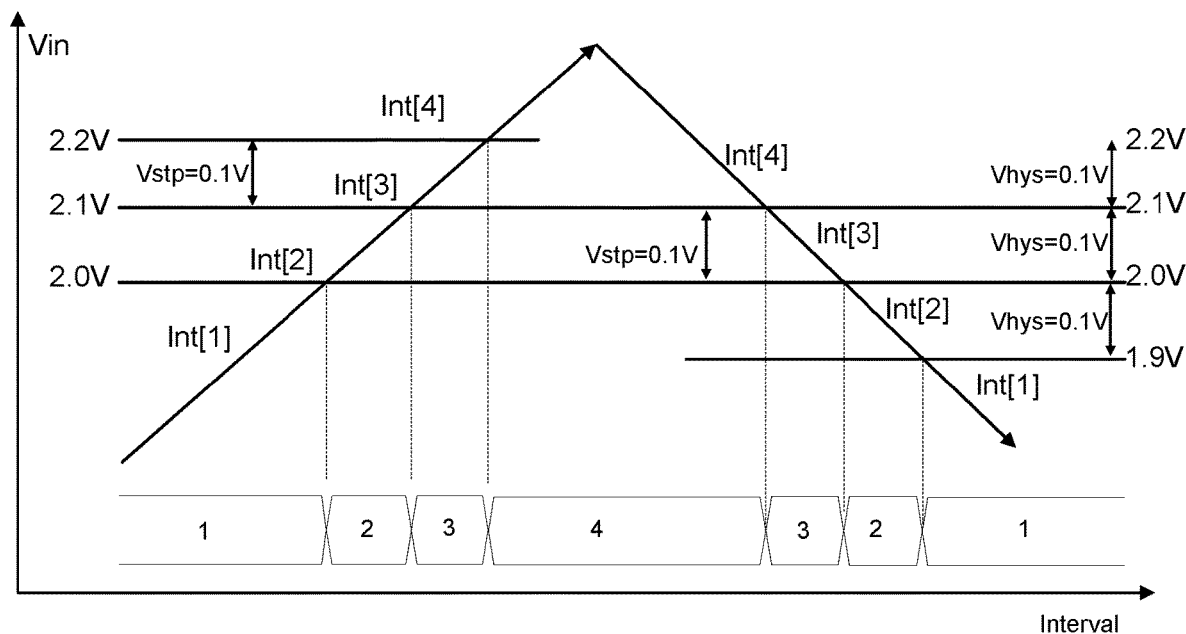
FIG. 5 shows a characteristic curve corresponding to a sensing circuit according to another embodiment of the present invention.

Please refer to FIG. 5, which shows a characteristic curve corresponding to a sensing circuit according to another embodiment of the present invention. This embodiment of FIG. 5 is similar to the embodiment of FIG. 4, but is different in that: in this embodiment of FIG. 5, a hysteresis level Vhys and an interval range Vstp are the same, and both are equal to 0.1V. That is, an ascending lower limit threshold Vthul [k] is equal to a descending upper limit threshold Vthdu[k]. As an example, for an interval Int[3] shown in FIG. 5, both the ascending lower limit threshold Vthul[3] and the descending upper limit threshold Vthdu[3] of the interval Int[3] are equal to 2.1V, which leads to the equivalence of the hysteresis level Vhys and the interval range Vstp, and both are equal to 0.1V in this embodiment.

Generally speaking, in order to achieve an effective hysteresis level, it is required that an ascending upper limit threshold Vthuu[k] is higher than a descending upper limit threshold Vthdu[k] and an ascending lower limit threshold Vthul [k] is higher than a descending lower limit threshold Vthdl[k].

Figure 6A:
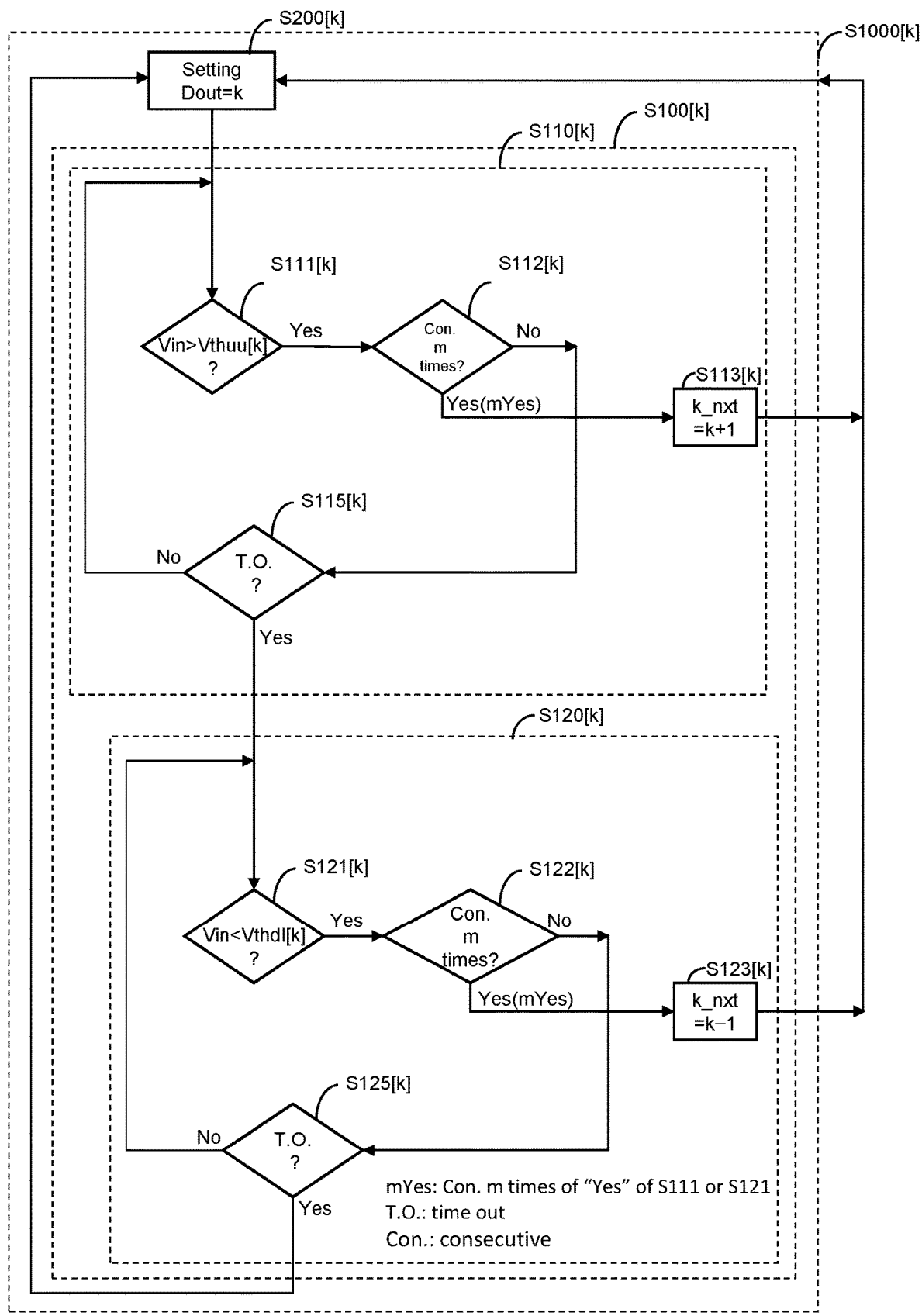
FIG. 6A shows a control flow diagram corresponding to a sensing circuit according to an embodiment of the present invention.

FIG. 6A shows a control flow diagram corresponding to a sensing circuit according to an embodiment of the present invention. The sensing circuit of the present invention can execute an interval determination step S1000[$k$] within any assigned interval number k, so as to periodically, based on a sampling frequency, determine and re-assign a corresponding interval according to the current level of the input signal Vin and generate a corresponding interval output signal Dout. Note that the interval output signal Dout is indicative of the corresponding interval, in for example a digital format, of the corresponding input signal Vin. The interval determination step S1000[$k$] comprises: a step S100[$k$] and a step S200[$k$].

Still referring to FIG. 6A, the step S100[$k$] includes: a step S110[$k$]: during a first time out period (i.e. before the first time out period has expired), when the input signal Vin is higher than the corresponding ascending upper limit threshold Vthuu[k] for consecutive m times (i.e., the determination results in the step S111[$k$] are "yes" for consecutive m times, also i.e. the determination result in the step S112[$k$] is "yes"), assigning an adjacent interval which is relatively higher as a following interval (corresponding to the step S113[$k$]) and executing the interval determination step corresponding to the following interval. That is, with reference to a present interval Int[k], a following interval determination step S1000[$k$+1] corresponding to the following interval Int[k+1] will be subsequently executed.

It is noteworthy that, in this embodiment, a serial number k for an interval and a corresponding range of the input signal Vin are arranged in a positive correlation manner, which is for better illustration, but not for limiting the scope of the present invention. In other words, the greater the value of the interval number k, the higher level the input signal Vin is within.

Besides, it is noteworthy that, the present invention adopts a filtered positive signal mYes to indicate a situation where a determination block for determining whether the input signal Vin is out of the range of the current interval Int [ k] (e.g., step S111 [k] or step S121[$k$]) is determined as "yes" for consecutive m times (i.e. corresponding to "yes" of the step S112 [k] or the step S122 [k]). In one perspective, the filtered positive signal mYes indicates that the input signal Vin is determined consistently, with the same comparing direction, out of the range of the current interval Int [ k]. It is noted here that when the terms "mYes" are used hereinafter in this specification, they are to be construed as referring to the term "mYes" just described. And, this manner of description and illustration are applied hereinafter as well. In a preferred embodiment, "m" is a positive integer which is greater than one.

The step S100 further includes: a step S120[$k$]: during a second time out period (i.e. before the second time out period has expired), when the input signal Vin is lower than the corresponding descending lower limit threshold Vthdl[k] for consecutive m times (i.e., the determination results in the step S121[$k$] are "yes" for consecutive m times, also i.e. the determination result in the step S122[$k$] is "yes"), assigning an adjacent interval which is relatively lower as a following interval (corresponding to the step S123[$k$]) and executing an interval determination step S1000[$k$–1] corresponding to the following interval Int[k–1].

Besides, when neither of the step S110 [k] and the step S120 [k] assigns any adjacent interval as a following interval, executing the corresponding step S200[$k$]. In other words, when the input signal Vin is neither higher than the corresponding ascending upper limit threshold Vthuu[k] for consecutive m times (i.e., a determination result in a step S115[$k$] is "yes") before the first time out period has expired, nor lower than the corresponding descending lower limit threshold Vthdl[k] for consecutive m times (i.e., a determination result in a step S125[$k$] is "yes") before the second time out period has expired, executing the corresponding step S200[$k$].

Subsequently, in the step S200[$k$]: generating an interval output signal Dout[k] corresponding to the interval Int[k], and, subsequently, entering into the step S100[$k$] corresponding to the interval Int[k].

In one embodiment, a timing point for comparing the input signal Vin and a limit threshold in an aforementioned steps can be determined based on the sampling frequency.

Please refer to FIG. 6A in conjugation with FIG. 5. To be more specific, taking a situation where k is assigned as 2 and m is implemented as 3 as an example, a corresponding step S110[2] will be: during the first time out period, when the input signal Vin is higher than the corresponding ascending upper limit threshold Vthuu[2] (i.e., 2.1V) for consecutive 3 times, assigning an interval Int[3] as a following interval and executing the interval determination step S1000[3] corresponding to the following interval Int[3]. With the same condition, a corresponding step S120[2] will be: during a second time out period, when the input signal Vin is lower than the corresponding descending lower limit threshold Vthdl[2] (i.e., 1.9V) for consecutive 3 times, assigning an interval Int[1] as a following interval and executing the interval determination step S1000[1] corresponding to the following interval Int[1].

Besides, when neither of the step S110 [2] and the step S120 [2] assigns any adjacent interval as a following interval, executing the corresponding step S200[2]. In other words, when the input signal Vin is not higher than the corresponding ascending upper limit threshold Vthuu[2] (i.e., 2.1V) for consecutive 3 times before the first time out period has expired, and, when the input signal Vin is not lower than the corresponding descending lower limit threshold Vthdl[2] (i.e., 1.9V) for consecutive 3 times before the second time out period has expired, executing the corresponding step S200[2].

Subsequently, in the step S200[2]: generating an interval output signal Dout[2] corresponding to the interval Int[2], and, subsequently, entering into the step S100[2] corresponding to the interval Int[2]. In one embodiment, an interval output signal Dout[k] can be a digital signal having at least one bit. For example, an interval output signal Dout[2] can be represented by a 4-bit binary code "0010".

It is noteworthy that, in one embodiment, a number of consecutive times of the step S111[$k$] can be equal to a number of consecutive times of the step S121[$k$]. In other embodiment, a number of consecutive times of the step S120[$k$] can be different from a number of consecutive times of the step S110[$k$]. The embodiments of the present invention adopts an implementation where "a number of consecutive times of the step S120[$k$] is equal to a number of consecutive times of the step S110[$k$]" (i.e. consecutive m times) as an exemplary explanation. Certainly, it should be understood that the implementation where "a number of consecutive times of the step S120 [k] is equal to a number of consecutive times of the step S110[$k$]" in the embodiments of the present invention is only an illustrative example, but not for limiting the broadest scope of the present invention. Besides, the comparison in for example the step S111[$k$] or the step S121[$k$] are determined and counted based on the sampling frequency. In one embodiment, the number for counting the determination result in the step S112 [k] or the step 122[$k$] can be reset when the step S110[k] or the step S120[k] is entered respectively. In one embodiment, the first time out period can be equal to the second time out period. In other embodiment, the first time out period can be different from the second time out period. In one embodiment, the first time out period and a second time out period can be correlated with the aforementioned sampling frequency, which for example can be obtained according to a period of the sampling frequency. In one embodiment, the aforementioned first time out period and the second time out period can be reset when the step S110[k] or the step S120[k] is entered respectively.

In addition, from a perspective of repeating operations (i.e., as shown by the step S113[k] in FIG. 6A), when a determination result of the step S112[k] is "yes", the sensing circuit of the present invention will assign an adjacent interval Int[k+1] which is relatively higher as a following interval (i.e., as shown by "k_nxt=k+1" in the step S113[k] in FIG. 6A) and executes the interval determination step S1000 [k_nxt=k+1] corresponding to the following interval (i.e., k_nxt=k+1). The mechanism as to how "k_nxt=k−1" in the step S123 [k] shown in FIG. 6A can be similarly derived from the aforementioned mechanism specifically for "k_nxt=k+1", wherein k_nxt indicates the sequence number of the following interval, the same hereinafter.

Figure 6B:
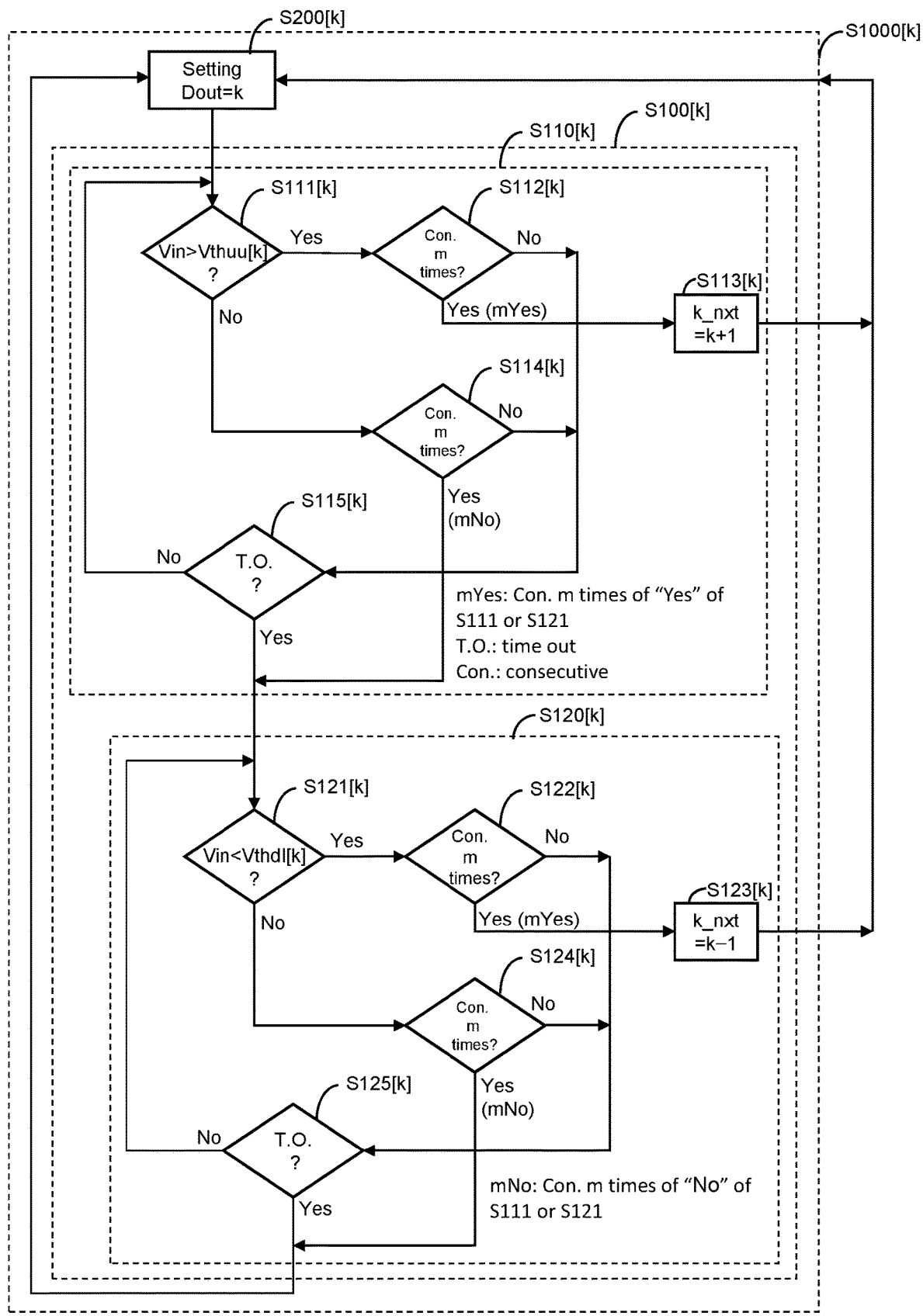
FIG. 6B shows a control flow diagram corresponding to a sensing circuit according to another embodiment of the present invention.

FIG. 6B shows a control flow diagram corresponding to a sensing circuit according to another embodiment of the present invention. This embodiment of FIG. 6B is similar to the embodiment of FIG. 6A, but is different in that: the step S110[k] shown in FIG. 6B further includes: determining whether the input signal Vin is lower than the corresponding ascending upper limit threshold Vthuu[k] for consecutive m times during the first time out period (i.e., a step S114[k]). In addition, the step S120[k] shown in FIG. 6B further includes: determining whether the input signal Vin is higher than the corresponding descending lower limit threshold Vthdl [k] for consecutive m times during the second time out period (i.e., a step S124[k]). When neither of the step S110[k] and the step S120 [k] assigns any adjacent interval as a following interval, the corresponding step S200[k] is subsequently executed when the following criteria are satisfied: in a case where the first time out period has expired (i.e., a determination result in a step S115[k] is "yes") or a determination result in a step S114[k] is "yes", and, in a case where the second time out period has expired (i.e., a determination result in a step S125[k] is "yes") or a determination result in a step S124[k] is "yes". Besides, it is noteworthy that, the present invention adopts a filtered negative signal mNo to indicate a situation where a determination block for determining whether the input signal Vin is out of the range of the current interval Int[k] (e.g., step S111[k] and step S121 [k]) is determined as "No" for consecutive m times (i.e. corresponding to "Yes" of the step S114[k] or the step S124[k]). In other words, the filtered negative signal mNo indicates that the input signal Vin is determined consistently within the range of the current interval Int[k] for consecutive m times before the corresponding time out period has expired. It is noted here that when the terms "mNo" are used hereinafter in this specification, they are to be construed as referring to the term "mNo" just described. And, this manner of description and illustration are applied hereinafter as well.

To elaborate in more detail, the embodiments of FIG. 6A and FIG. 6B determines multiple intervals in correspondence with an input signal Vin, with respective corresponding hysteresis level, through a comparison between the input signal Vin and an ascending upper limit threshold Vthuu[k] and through a comparison between the input signal Vin and an descending upper limit threshold Vthdl[k]. Besides, the steps for determining whether an input signal Vin exceeds or does not exceed a limit threshold for consecutive m times in the embodiments of FIG. 6A and FIG. 6B is substantially equivalent to filtering the comparison between the input signal Vin and the limit thresholds. The filtered comparison result indicates that the relationship between the input signal Vin and a limit threshold is relatively firmly determined.

Additionally, likewise, a first time out period and a second time out period are also equivalent to filtering the comparison between an input signal Vin and a limit threshold. In this case, the filtered comparison result indicates that it is unable to affirmatively determine the relationship between an input signal Vin and a limit threshold. From one perspective, in this case, this embodiment executes a relatively conservative subsequent step that the interval Int[k] keeps unchanged. The bandwidth of the aforementioned filtering is correlated with the sampling frequency, the consecutive counting number m, the first time out period and the second time out period.

Figure 7:
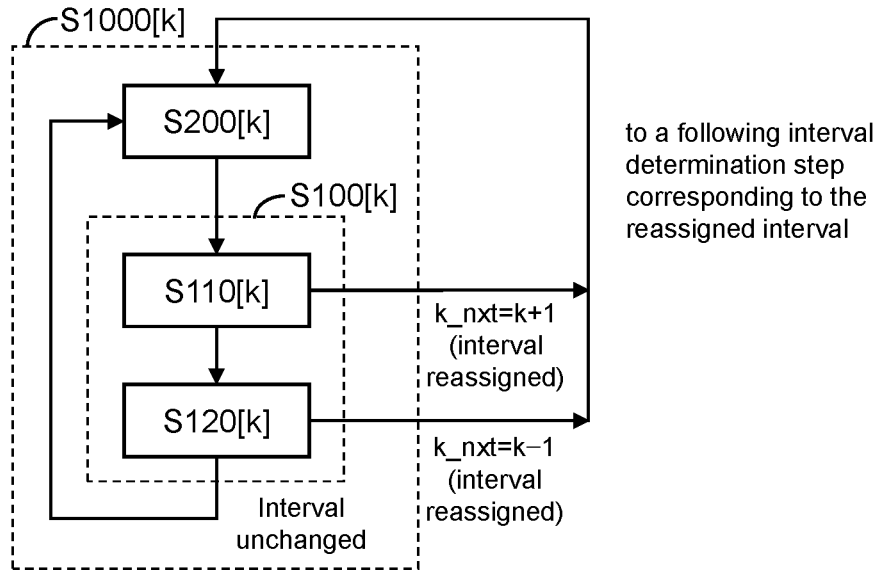
FIG. 7 and FIG. 8 show control flow diagrams corresponding to a sensing circuit according to two embodiments of the present invention, respectively.
Figure 8:
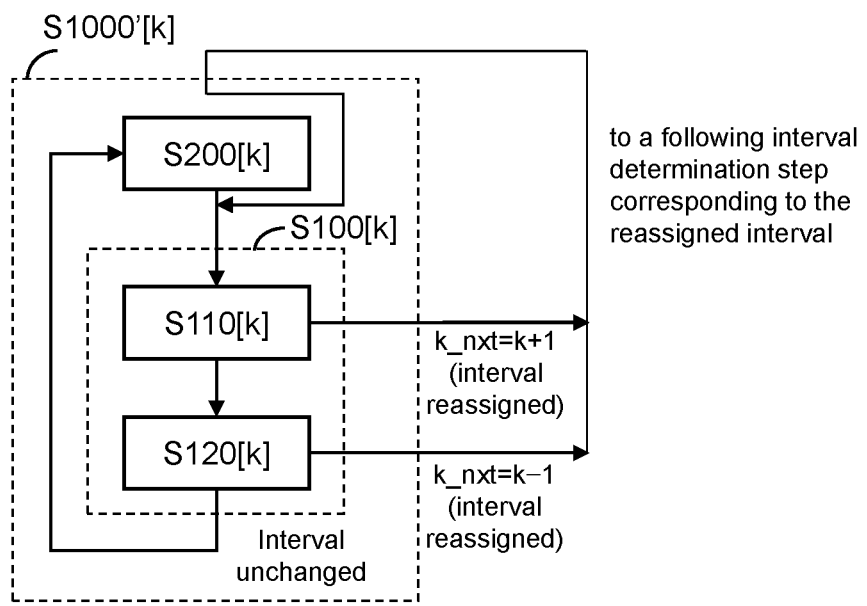

FIG. 7 and FIG. 8 show control flow diagrams corresponding to a sensing circuit according to two embodiments of the present invention, respectively. FIG. 7 is a simplified version of control flow diagrams shown in FIG. 6A and FIG. 6B. In this embodiment shown in FIG. 7, when an interval reassigning occurs in a step S110[k] or in a step S120[k], a step S200[k_nxt] is firstly executed when entering the newly reassigned interval determination step S1000[k_nxt] corresponding to the following interval Int[k_nxt], wherein k_nxt, which could be k+1 or k−1, indicates the sequence number of the following interval. FIG. 6A and FIG. 6B operates in a same manner as FIG. 7.

This embodiment of FIG. 8 is similar to the embodiment of FIG. 7, but is different in that: in the embodiment of FIG. 8, when an interval reassigning occurs in a step S110[k] or in a step S120[k], a step S100[k_nxt] is firstly executed when entering the newly re-assigned interval determination step S1000'[k_nxt] corresponding to the following interval.

Figure 9:
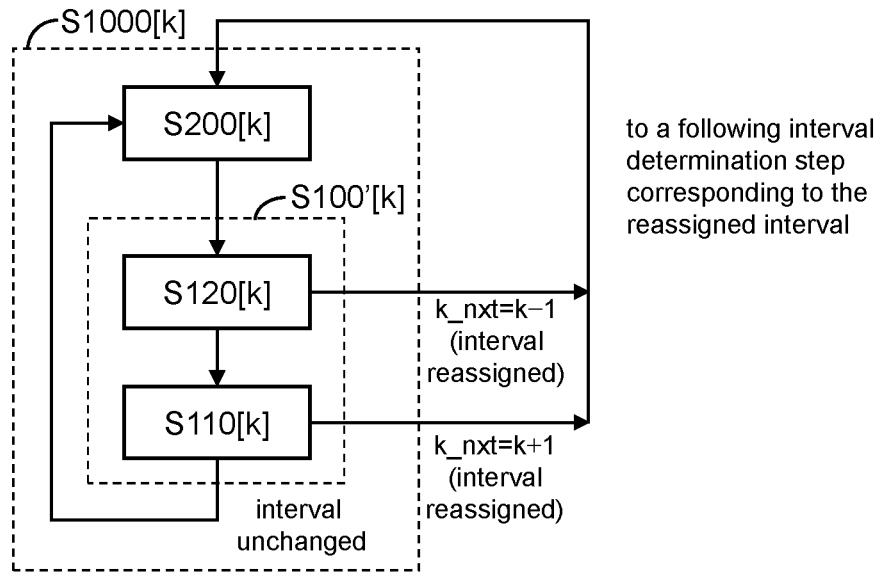
FIG. 9 and FIG. 10 show control flow diagrams corresponding to a sensing circuit according to another two embodiments of the present invention, respectively.
Figure 10:
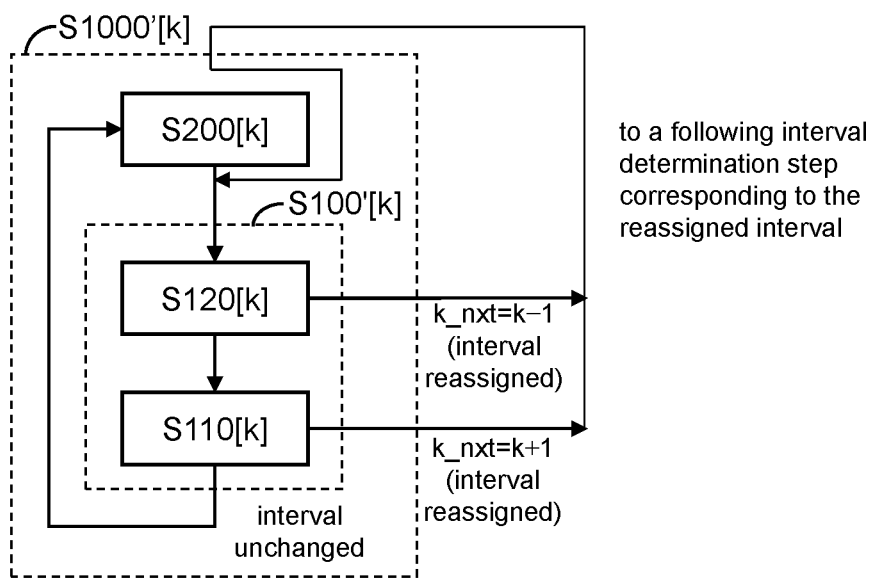

Please refer to FIG. 9 and FIG. 10, which show control flow diagrams corresponding to a sensing circuit according to another two embodiments of the present invention, respectively. This embodiment of FIG. 9 is similar to the embodiment of FIG. 7, but is different in that: in a step S100'[k] shown in the embodiment of FIG. 9, a step S120[k] is executed prior to a step S110[k]. By contrast, in a step S100[k] shown in the embodiment of FIG. 7, a step S110[k] is executed prior to a step S120[k]. Besides, this embodiment of FIG. 10 is similar to the embodiment of FIG. 8, but is different in that: in a step S100'[k] shown in the embodiment of FIG. 10, a step S120[k] is executed prior to a step S110[k]. By contrast, in a step S100[k] shown in the embodiment of FIG. 8, a step S110[k] is executed prior to a step S120[k].

It is noteworthy that, when re-assigning to an adjacent interval does not occur during one of the step S110[k] or the step S120[k] which is executed firstly in the step S100 [k] (or S100'[k]), the other one will be successively executed.

Figure 11:
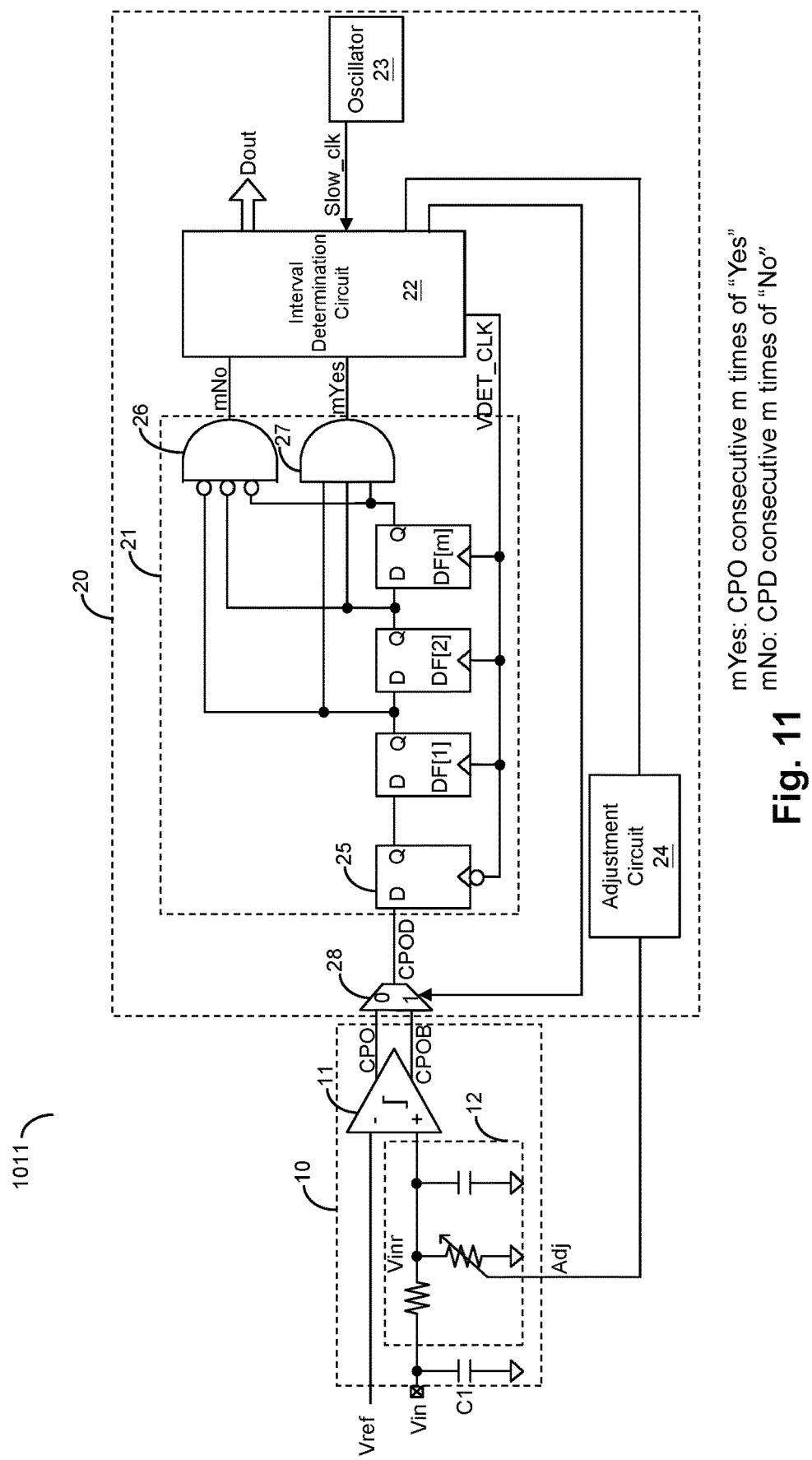
FIG. 11 shows a specific embodiment of a sensing circuit of the present invention.

FIG. 11 shows a specific embodiment of a sensing circuit (i.e., sensing circuit 1011) of the present invention. In one embodiment, the multi-interval sensing circuit 1011 having multi-hysteresis comprising: a comparison circuit 10 and a control circuit 20. The comparison circuit 10 is configured to operably compare the input signal Vin with the corresponding limit threshold, so as to generate a comparison result CPO. The control circuit 20 is configured to operably select the corresponding limit threshold and sample the comparison result CPO based on a sampling frequency, so as to execute the aforementioned interval determination step S1000[*k*], thus generating an interval output signal Dout. The interval output signal Dout is indicative of the corresponding interval Int[k] of the corresponding input signal Vin. The corresponding limit thresholds are generated according to at least a limit threshold required for the interval determination step S1000[*k*]. To elaborate in more detail, in a step S110[*k*] as shown for example in FIG. 6B, the comparison circuit 10 is configured to operably compare the input signal Vin with a corresponding ascending upper limit threshold Vthuu [k] (i.e., the step S111[*k*]). In a step S120[*k*], the comparison circuit 10 is configured to operably compare the input signal Vin with a corresponding descending lower limit threshold Vthdl [k] (i.e., the step S121[*k*]).

It is noteworthy that, in one embodiment, it is not required for the comparison circuit 10 to directly compare the input signal Vin to the corresponding limit threshold. Instead, the comparison circuit 10 can generate a comparison result CPO through comparing a signal related to the input signal Vin to a signal related to the corresponding limit threshold, the details of which will be explained in detail hereinafter.

Please still refer to FIG. 11. In one embodiment, the control circuit 20 includes: a digital filter circuit 21 and an interval determination circuit 22. The digital filter circuit 21 includes: m flip-flops (e.g., as shown by flip-flops DF[1] ~DF[3] in FIG. 11; wherein m is for example equal to 3) which are cascaded (i.e. connected in a serial manner). Each flip-flop (e.g., as shown by flip-flops DF[1]~DF[3]) is configured to operably sample and transfer the comparison result sequentially and periodically based on the sampling frequency. The state output signals (i.e., Q) of the corresponding flip-flops DF[1]~DF[3] successively correspond to consecutive m times of the sampled comparison results. In other words, the state output signals (Q) of the corresponding flip-flops DF[1]~DF[3] successively correspond to a most recently sampled comparison result and two previously sampled comparison results one after one, respectively. Besides, in one embodiment, the digital filter circuit 21 further includes: an AND logic circuit 27 having m input terminals. The AND logic circuit 27 is configured to operably receive the state output signals of the m of flip-flops, so as to determine whether the state output signals are all enabled (e.g. at a high level), thereby enabling a filtered positive signal mYes. The filtered positive signal mYes is indicative of a situation where: a determination result of the aforementioned step S111[*k*] or step S121[*k*] is determined as "Yes" for consecutive m times. Besides, the interval determination circuit 22 is configured to operably determine whether to execute an interval determination step S1000 [*k*_nxt] corresponding to a following interval Int[k_nxt] according to a criteria where whether all consecutive m times of the sampling signals are enabled and/or a criteria where whether the aforementioned time out periods have expired.

To elaborate in more detail, in this embodiment, the interval determination circuit 22 can correspond to a control flow diagram shown in FIG. 6A. Under such situation, the interval determination circuit 22 is configured to operably execute the following operations in the step S110 [k] and the step S120 [k] shown in FIG. 6A: the step S110[*k*] includes: when a filtered positive signal mYes is enabled during a first time out period, which indicates that the input signal Vin is higher than a corresponding ascending upper limit threshold Vthuu[k] for consecutive m times, assigning an adjacent interval (i.e., assigning an adjacent interval Int[k+1] which is relatively higher as a following interval. The step S120[*k*] includes: when the filtered positive signal mYes is enabled during a second time out period, which indicates that the input signal Vin is lower than a corresponding descending lower limit threshold Vthdl [k] for consecutive m times, assigning an adjacent interval (i.e., assigning an adjacent interval Int[k−1] which is relatively lower as a following interval. When the corresponding filtered positive signal mYes in the step S110[*k*] or the step S120[*k*] is not enabled during the first time out period or the second time out period, executing the other step in the step S100[*k*] or executing the corresponding step S200[*k*]. In one embodiment, when neither of the corresponding filtered positive signals mYes in the step S110 [k] and the step S120[*k*] is enabled during the first time out period nor the second time out period, executing the corresponding step S200[*k*].

Please still refer to FIG. 11. In one embodiment, the digital filter circuit 21 further includes: an AND logic circuit 26 having m of input terminals. The AND logic circuit 26 is configured to operably receive the m state output signals of the m flip-flops, so as to determine whether the m state output signals are all at a disable state (e.g. a low level), thereby enabling a filtered negative signal mNo. The filtered negative signal mNo is indicative of a situation where: a determination result of the aforementioned step S111[*k*] or step S121[*k*] is determined as "No" for consecutive m times.

In this embodiment, the interval determination circuit 22 can correspond to a control flow diagram shown in FIG. 6B. In this embodiment, the interval determination circuit 22 is configured to operably execute the following operations in the step S114[*k*] and the step S124[*k*] shown in FIG. 6B: the step S114[*k*] includes: determining whether an input signal Vin is lower than a corresponding ascending upper limit threshold Vthuu[k] for consecutive m times during a first time out period according to whether the filtered negative signal mNO is during the first time out period. The step S124[*k*] includes: determining whether the input signal Vin is higher than a corresponding descending lower limit threshold Vthdl[k] for consecutive m times during a second time out period according to whether the filtered negative signal mNo is turned enabled during the second time out period. When the corresponding filtered negative signal mNo in the step S110[*k*] or the step S120[*k*] is not enabled during the first time out period or the second time out period, executing the other step in the step S100[*k*] or executing the corresponding step S200[*k*]. More specifically, the digital filter circuit 21 is configured to operably execute the corresponding step S112[*k*], step S114[*k*], step S122[*k*] and step S124[*k*] shown in FIG. 6B.

Please still refer to FIG. 11. In one embodiment, the comparison circuit 10 includes: a comparator 11, which is configured to operably compare a reference signal Vref with an input related signal Vinr which is correlated with the input signal Vin, so as to generate the comparison result CPO. In this embodiment, the control circuit 10 further includes: an adjustment circuit 24, which is configured to operably generate a corresponding adjustment signal Adj according to the corresponding limit threshold (e.g., a corresponding ascending upper limit threshold Vthuu[k] in the step S111[*k*] or a corresponding descending lower limit threshold Vthdl[k] in the step S121[*k*]). The adjustment signal Adj is configured to operably adjust the input related signal Vinr, so that a comparison between the reference signal Vref and the input related signal Vinr corresponds to a comparison between the input signal Vin and the corresponding limit threshold (e.g., a corresponding ascending upper limit threshold Vthuu[k] in the step S111[*k*] or a corresponding descending lower limit threshold Vthdl[k] in the step S121[*k*]).

To elaborate in more detail, in this embodiment, the adjustment signal Adj is configured to operably adjust a dividing ratio of a voltage-divider circuit 12, so as to achieve the aforementioned adjustment. In other embodiment, it is also practicable and within the scope of the present invention, alternatively, that the adjustment signal Adj is configured to operably adjust the reference signal Vref in a case where the input related signal Vinr is a constant. In one specific embodiment, the divider circuit 12 in FIG. 11 can be configured to the signal path of the reference signal Vref.

Additionally, if the direction of the inequality for comparing the input signal Vin and the limit threshold in the step S111[k] is different from that of the step S121[k], in one embodiment, as shown in FIG. 11, a logic circuit (e.g., a multiplexer 28) can be configured as being connected downstream to the comparator 11. The multiplexer 28 is configured to operably change a logic level thereof according to the direction of the inequality in step S111[k] and step S121[k]. In one embodiment, a comparison result CPOB and a comparison result CPO are complementary to each other. A comparison result CPOD is a signal in which the logical level has been adjusted, which is selected by the multiplexer 28. In other embodiments, the aforementioned exchange in comparison direction can be alternatively achieved by switching between an in-phase input terminal and a reversed-phase input terminal of the comparator 11, or, by replacing the aforementioned AND logic circuit 26 by a corresponding logic circuit.

In one embodiment, the interval determination circuit 22 is further configured for timing the first time out period and/or the second time out period, so as to determine whether the corresponding time out periods of the aforementioned step S111[k] or the step S112[k] has expired (i.e., time out, indicated by "T.O." as shown) in FIG. 6A and FIG. 6B. In one embodiment, the control circuit 20 further includes an oscillator 23, which is configured to operably provide a clock signal Slow_clk. In this embodiment, the interval determination circuit 22 can generate, according to the clock signal Slow_clk, a sampling clock signal VDET_CLK which is configured to operably operate the flip-flops DF[1]-DF[3] to sample the comparison results periodically based on the sampling frequency. In one embodiment, the digital filter circuit 21 further includes a flip-flop 25, which is coupled between the comparator 11 and the flip-flops DF[1]~DF[3]. The flip-flop 25 is configured to operably pre-sample the comparison result CPO (or CPOD) according to a clock signal which is inverse to the clock signals of the flip-flops DF[1]~DF[3], thereby ensuring the comparison result CPO sampled via the digital filter circuit 21 has settled.

Several specific embodiments will be hereinafter fully elaborated according to the aforementioned sensing circuit 1011 and interval determination step.

Figure 12A:
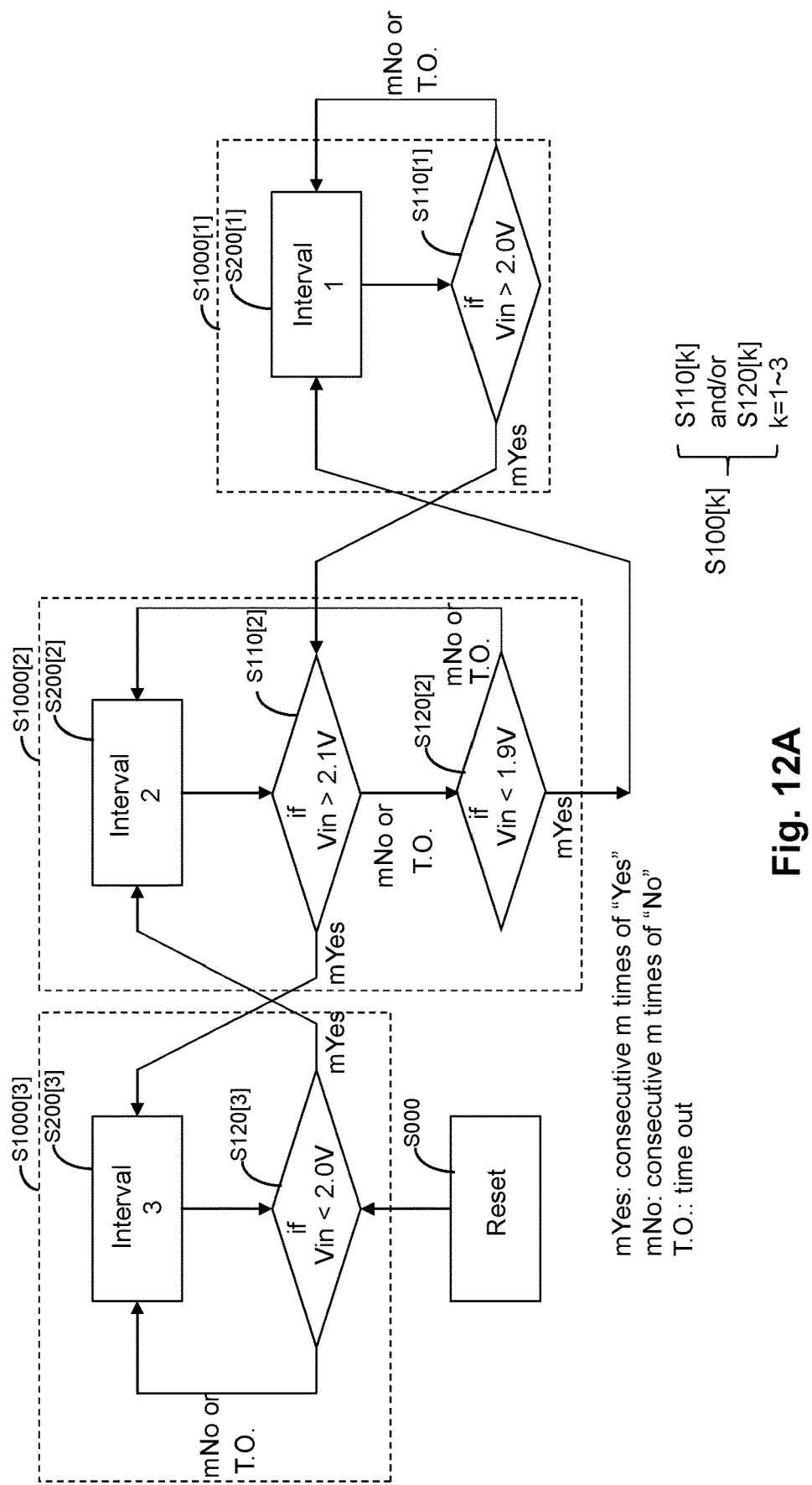
FIG. 12A and FIG. 12B show control flow diagrams corresponding to a sensing circuit according to two specific embodiments of the present invention, respectively.
Figure 12B:
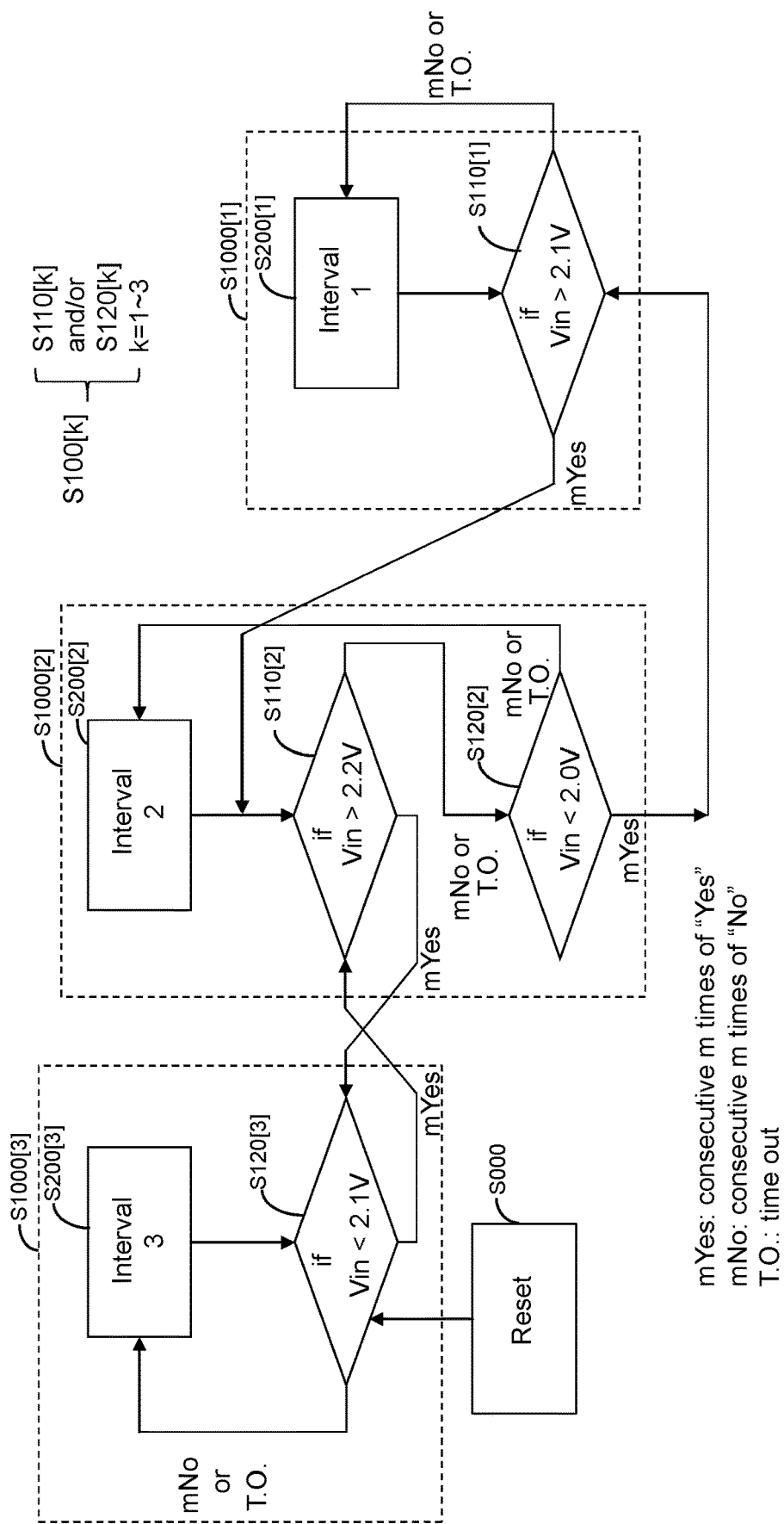

Please refer to FIG. 12A and FIG. 12B, which show control flow diagrams corresponding to a sensing circuit according to two specific embodiments of the present invention, respectively. Please refer to FIG. 12C, which shows a characteristic curve corresponding to embodiments of FIG. 12A and FIG. 12B. In this embodiment, the sensing circuit has three intervals (i.e., Int[1], Int[2] and Int[3]). Each respective interval (i.e., Int[1], Int[2] and Int[3]) has a hysteresis level Vhys and an interval range Vstp which are both equal to 0.1V (not including the interval ranges of the highest interval and the lowest interval). To be more specific, as an example, an interval Int[2] shown in FIG. 12C has corresponding limit thresholds including: an ascending upper limit threshold Vthuu[2] of 2.1V, an ascending lower limit threshold Vthul[2] of 2.0V, a descending upper limit threshold Vthdu[2] of 2.0V and a descending lower limit threshold Vthdl[2] of 1.9V.

Figure 12C:
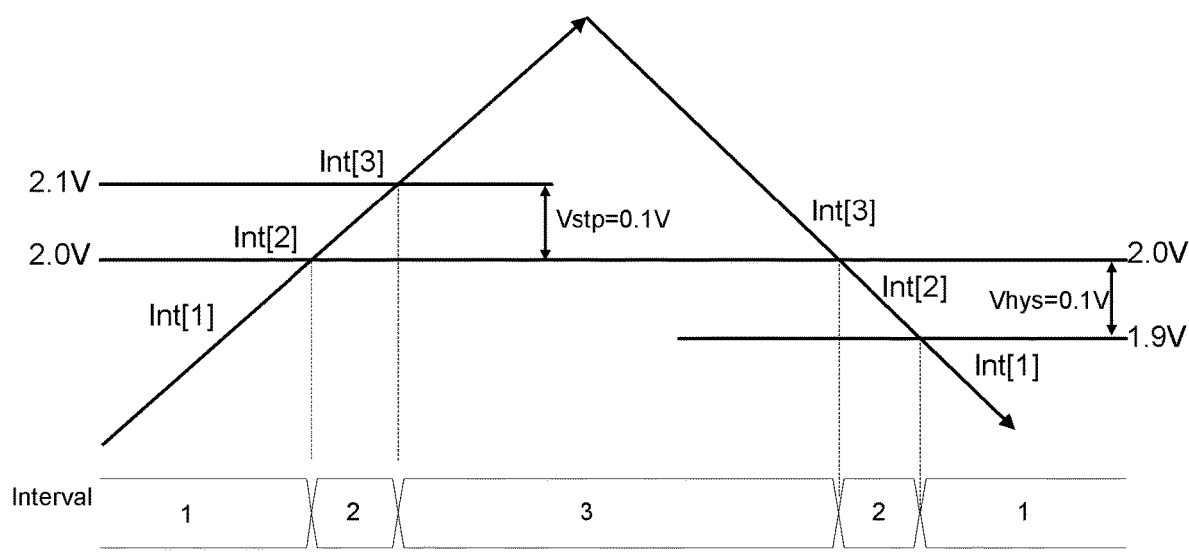
FIG. 12C shows a characteristic curve corresponding to embodiments of FIG. 12A and FIG. 12B.

It is noteworthy that, in this embodiment, because an interval Int[3] shown in FIG. 12C is the highest interval, the interval Int[3] simply has an ascending lower limit threshold Vthul[3] of 2.1V, and a descending lower limit threshold Vthdl[3] of 2.0V. That is, the interval Int[3] does not have any upper limit threshold. Besides, in this embodiment, because an interval Int[1] shown in FIG. 12C is the lowest interval, the interval Int[1] simply has an ascending upper limit threshold Vthuu[1] of 2.0V, and a descending upper limit threshold Vthdu[1] of 1.9V. That is, the interval Int[1] does not have any lower limit threshold.

Please refer to FIG. 12A. In one embodiment, a specific interval determination step shown in FIG. 12A can be obtained through combining the embodiments shown in FIG. 6B, FIG. 7 and FIG. 11, so as to achieve the characteristic curve as shown in FIG. 12C. Firstly, a reset step S000 is executed. In the reset step S000, an interval output signal Dout is firstly reset, while in the meantime, a sequence number of the interval is reset. For example, in this embodiment, an initial interval Int[3] is assigned, and therefore an interval determination step S1000[3] (more specifically the step S100[3]) will be executed. Subsequently, the step S120[3] in the interval determination step S1000[3] will be executed, wherein the step S120[3] determines whether the input signal Vin is lower than a corresponding descending lower limit threshold Vthdl[3] (which is equal to 2.0V) for consecutive m times. If the filtered positive signal mYes is enabled before time out, k will be re-assigned as 2 (i.e., k=2) and therefore an interval determination step S1000[2] corresponding to the following interval Int[2] will be executed. In this embodiment shown in FIG. 7, when entering the interval determination step S1000[2], the step S200[2] will be executed firstly.

If the step S120[3] is timed out or if the filtered negative signal mNo is enabled before time out, a corresponding step S200[3] will be executed, such that an interval output signal Dout correspond to an interval Int[3] will be updated.

Please still refer to FIG. 12A. When k is assigned as 2 (i.e., k=2), an interval determination interval determination step S1000[2] will be executed. This embodiment corresponds to the embodiment in FIG. 7, wherein when executing the interval determination step S1000[2], the step S200[2] will be executed firstly. In other words, an interval output signal Dout will be updated firstly, such that the interval output signal Dout will correspond to an interval Int[2]. Subsequently, the step S110[2] and the step S120[2] in the step S100[2] will be executed. Subsequently, according to a similar determination result, this embodiment can determine to execute an interval determination step S1000[1] or an interval determination step S1000[3] corresponding to an adjacent interval Int[1] or an adjacent interval Int[3] which are adjacent to the present interval Int[2]. Alternatively, this embodiment can determine to keep at the present interval Int[2] and therefore an interval determination step S1000[2] will be executed once again. By looping the corresponding interval determination steps, this embodiment can keep determining the corresponding interval according to the input signal Vin, with hysteresis and filtering.

It is noteworthy that, the reset step S000 can alternatively assign any initial value of a level sequence k, so as to proceed the step S100[k] of the corresponding initial interval Int[k]. In addition, the reset step S000 can be followed by either one of the step S100[k] or the step S200[k].

In addition, the execution sequence of the step S100[k] and the step S200[k] arranged in the interval determination step S1000[k] shown in FIG. 12A can be swapped, as shown in FIG. 9.

Please refer to FIG. 12B. In one embodiment, a specific interval determination steps shown in FIG. 12B can be obtained through combining the embodiments shown in FIG. 6B, FIG. 7 and FIG. 11, so as to achieve the characteristic curve as shown in FIG. 12C. This embodiment of FIG. 12B is similar to the embodiment of FIG. 12A, but is different in that: in this embodiment of FIG. 12B, when an interval re-assigning occurs and it is therefore determined to execute an interval determination step S1000[k_nxt] corresponding to a following adjacent interval, during the execution of the interval determination step S1000[k_nxt], the step S100[k_nxt] is executed firstly. To elaborate in more detail, in this embodiment (which correspond to FIG. 8), in a case where a step S110 [k] exists, when the step S100[k] is entered, the step S110[k] is executed firstly. In other embodiment, it is also practicable and within the scope of the present invention that during the execution of the step S100[k], the step S120[k] is executed firstly.

Besides, it is noteworthy that, in this embodiment of FIG. 12B, when entering the interval determination step S1000[k_nxt] of a following adjacent interval, the step S100[k_nxt] is firstly executed prior to the step S200[k_nxt] (i.e., generating an level output signal Dout corresponding to the interval). As a result, as compared to the embodiment of FIG. 12A, this embodiment of FIG. 12B can filter out more noise of the input signal Vin.

Figure 13A:
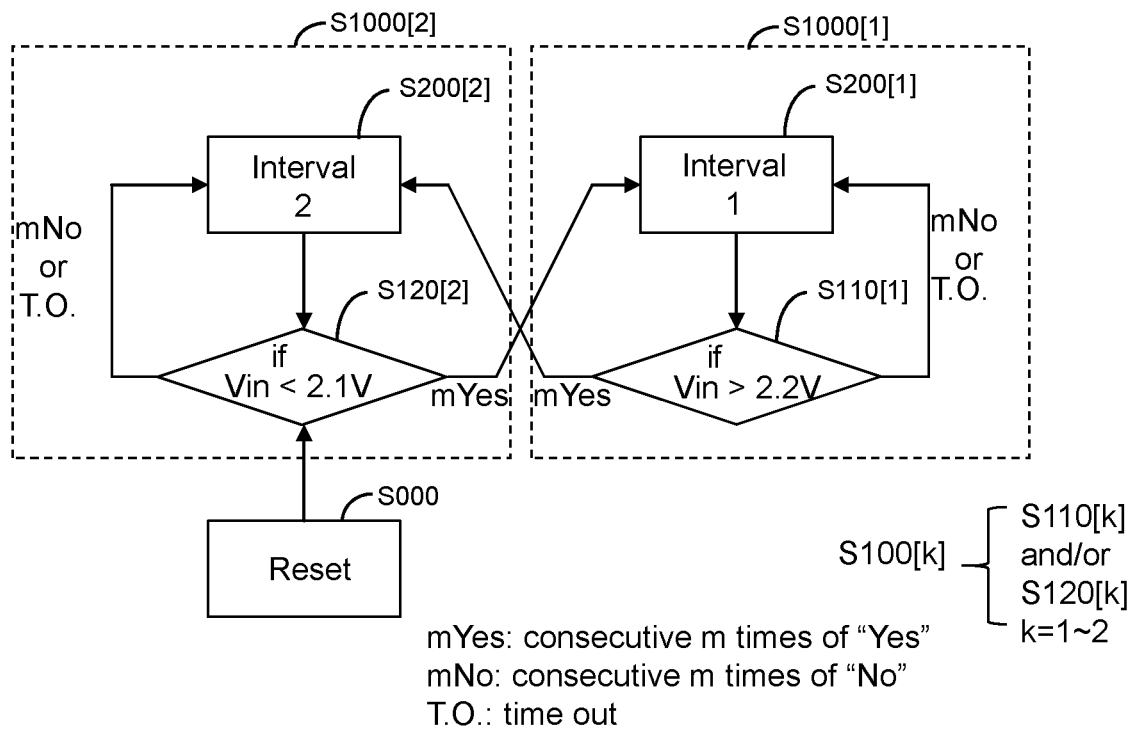
FIG. 13A and FIG. 13B show control flow diagrams corresponding to a sensing circuit according to two specific embodiments of the present invention, respectively.
Figure 13B:
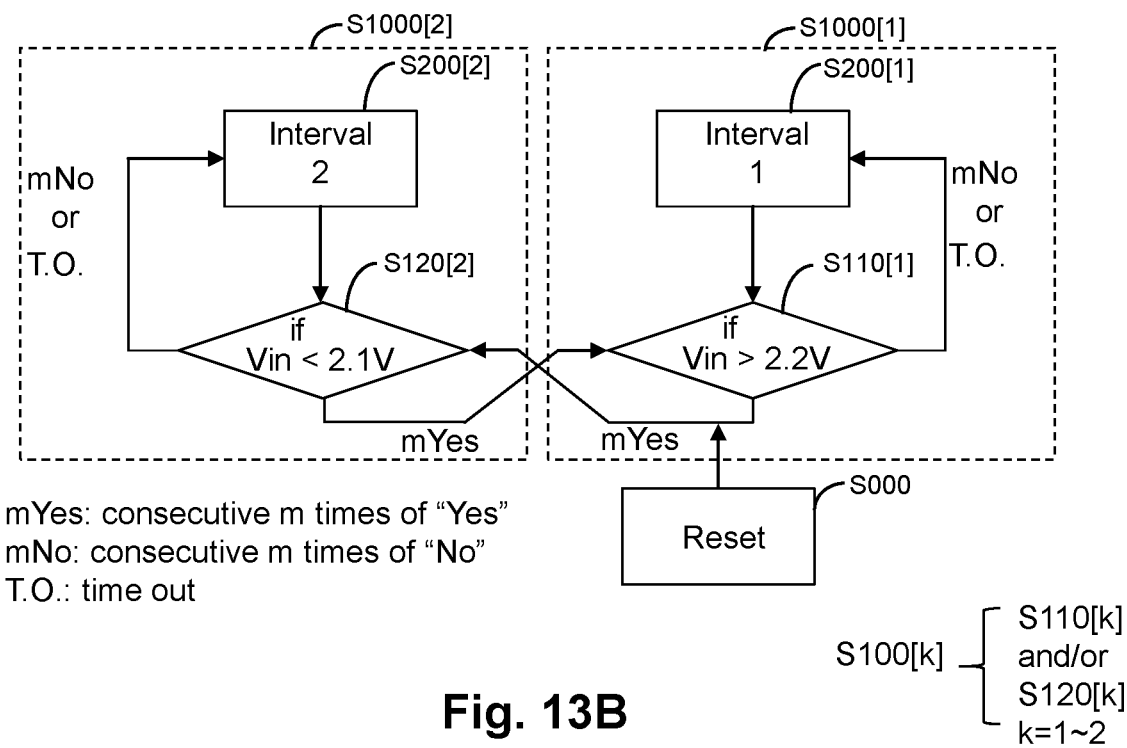
Figure 13C:
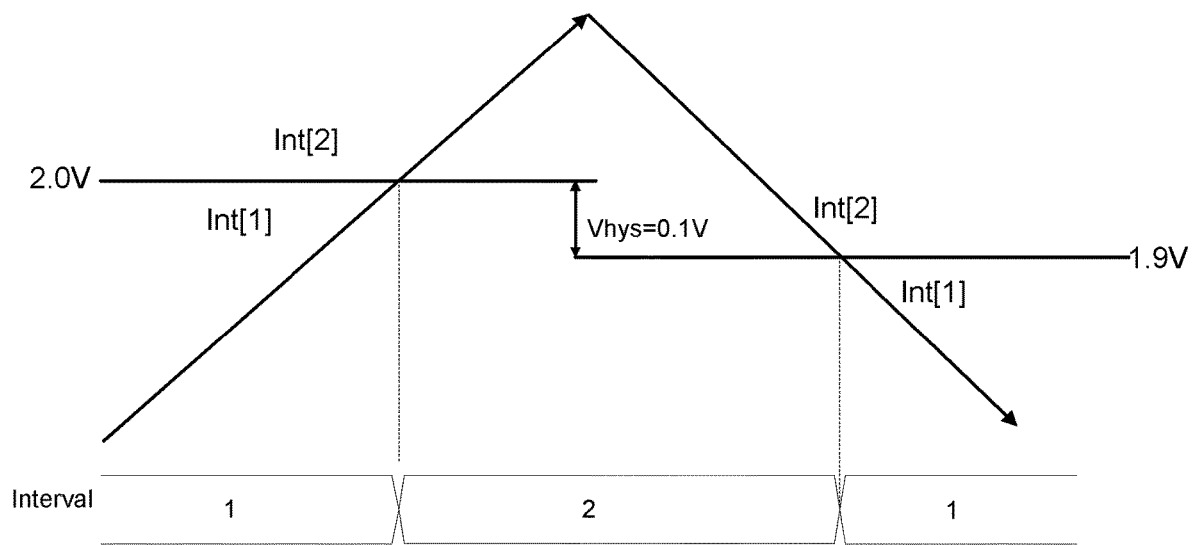
FIG. 13C shows a characteristic curve corresponding to embodiments of FIG. 13A and FIG. 13B.

FIG. 13A and FIG. 13B show control flow diagrams corresponding to a sensing circuit according to two specific embodiments of the present invention, respectively. FIG. 13C shows a characteristic curve corresponding to embodiments of FIG. 13A and FIG. 13B. Because the embodiment of FIG. 13C simply has two intervals (i.e., an interval Int[1] and an interval Int[2]), the interval Int[1] and the interval Int[2] correspond to a lowest interval and a highest interval, respectively. FIG. 13A is similar to FIG. 12A, whereas, FIG. 13B is similar to FIG. 12B. FIG. 13A and FIG. 13B clearly indicate that: it is also practicable and within the scope of the present invention that a multi-interval sensing circuit having multi-hysteresis according to the present invention can be applied in an implementation where there is only one single threshold (e.g., either an ascending threshold or a descending threshold) for determining an interval and there is only one single hysteresis voltage.

Figure 14A:
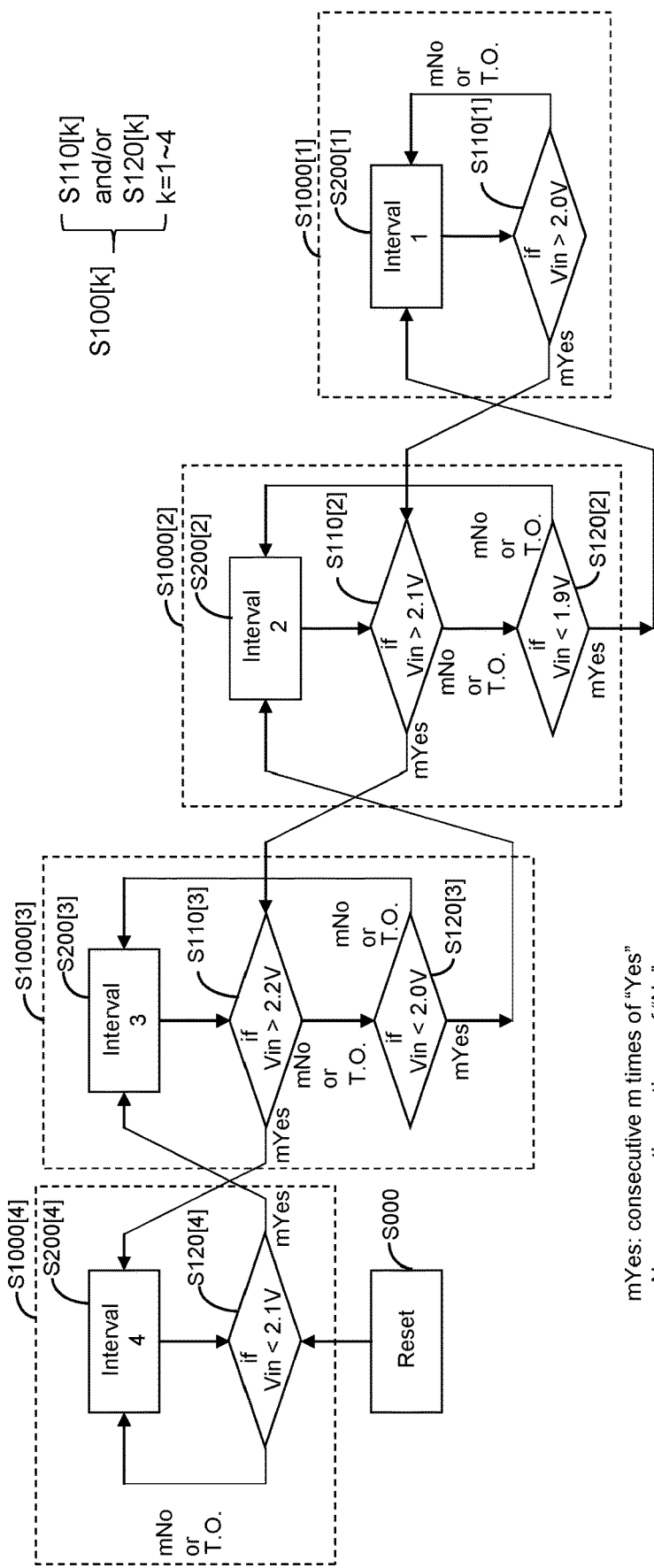
FIG. 14A and FIG. 14B show control flow diagrams corresponding to a sensing circuit according to two specific embodiments of the present invention, respectively.
Figure 14B:
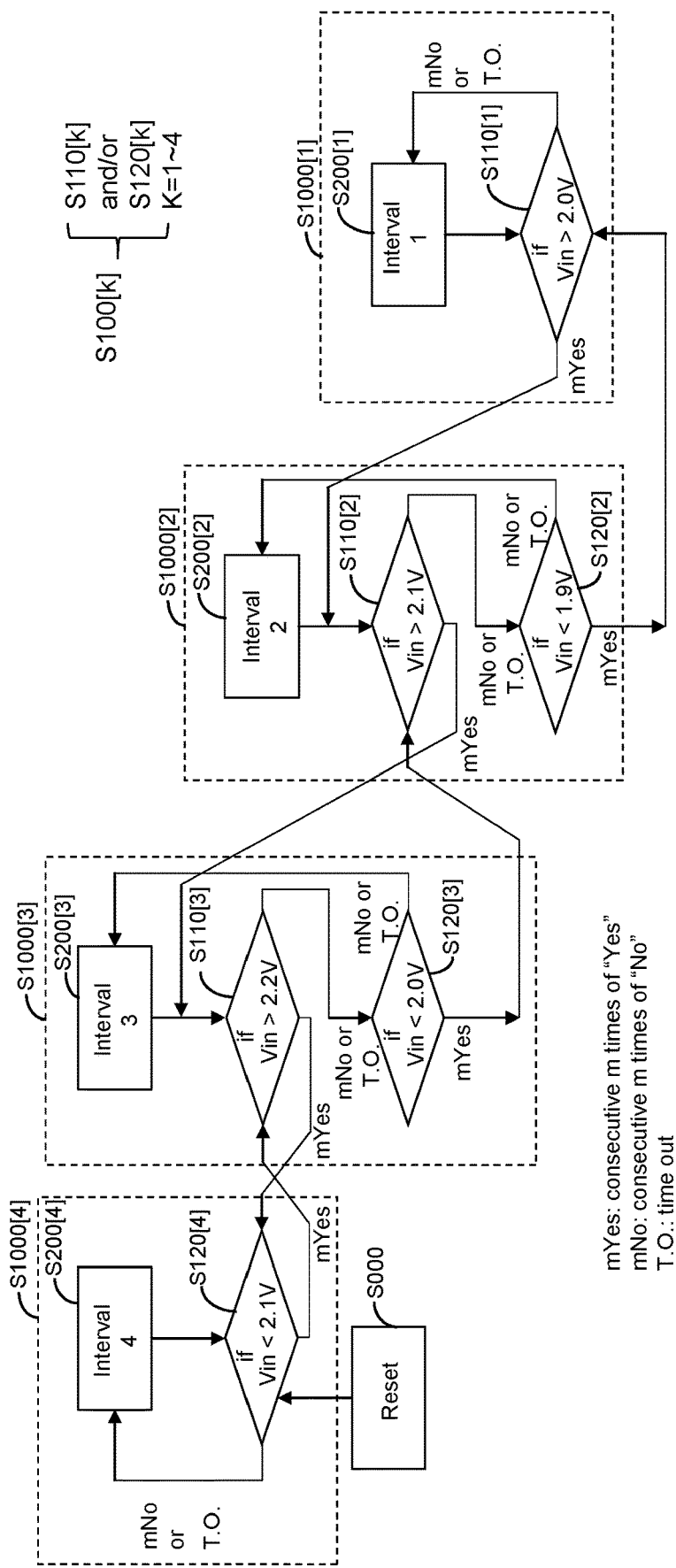

FIG. 14A and FIG. 14B show control flow diagrams corresponding to a sensing circuit according to two specific embodiments of the present invention, respectively. The embodiments of FIG. 14A and FIG. 14B demonstrate a specific embodiment corresponding to the embodiment of FIG. 5. This embodiment of FIG. 14A is similar to the embodiment of FIG. 12A, whereas, this embodiment of FIG. 14B is similar to the embodiment of FIG. 12B. FIG. 14A and FIG. 14B clear indicate that: a multi-interval sensing circuit having multi-hysteresis according to the present invention can be generalized to applications having any numbers of intervals.

The aforementioned input signal Vin can be in forms of a voltage, a current, power or a signal in any other form which requires to divided into different intervals with hysteresis. Depending upon which type of signal is adopted, it is simply required for the present invention to configure corresponding comparison circuit, so as to determine an interval corresponding to an input signal via all the aforementioned embodiments.

It is noteworthy that the sensing circuit according to the present invention is applicable for use in supply voltage sensing, especially for battery powered devices for example but not limited to wireless optical mice. A high accuracy, noise filtered corresponding interval of the supply voltage, of a wireless optical mouse can be provided for determining for example settings of accuracy of positioning, speed, light intensity, etc. according to the supply voltage for optimizing the performance and battery life of the wireless mouse.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A multi-interval sensing circuit, which is configured to operably sense an input signal, so as to determine an interval, among plural intervals with hysteresis, according to a level of the input signal, wherein each of the plural interval has corresponding plural limit thresholds and a corresponding hysteresis level, wherein the plural limit thresholds include: a corresponding ascending upper limit threshold and a corresponding descending lower limit threshold; the multi-interval sensing circuit comprising:

a comparison circuit, which is configured to operably generate a comparison result according to a comparison between the input signal and the corresponding limit threshold; and a control circuit, which is configured to operably select the corresponding limit threshold and sample the comparison result periodically based on a sampling frequency, so as to execute an interval determination step, thus generating an interval output signal, wherein the interval output signal is indicative of the corresponding interval of the input signal, wherein the corresponding limit threshold is selected from at least one limit threshold corresponding to the interval determination step, wherein the interval determination step includes a step S100 and a step S200, wherein:

the step S100 includes:

a step S110: before a first time out period expires, when the input signal is higher than the corresponding ascending upper limit threshold for consecutive plural times, assigning an adjacent interval which is relatively higher as a following interval and executing the interval determination step corresponding to the following interval; and a step S120: before a second time out period expires, when the input signal is lower than the corresponding descending lower limit threshold for consecutive plural times, assigning an adjacent interval which is relatively lower as a following interval and executing the interval determination step corresponding to the following interval;

wherein when neither of the step S110 and the step S120 assigns an adjacent interval as a following interval, executing the corresponding step S200;

wherein the step S200 includes: generating the interval output signal corresponding to the interval, and, subsequently, entering the step S100 corresponding to the interval.

2. The multi-interval sensing circuit of claim 1, wherein:
the step S110 further includes a step S114: determining whether the input signal is lower than the corresponding ascending upper limit threshold for the consecutive plural times before the first time out period expires; and
the step S120 further includes a step S124: determining whether the input signal is higher than the corresponding descending lower limit threshold for the consecutive plural times before the second time out period expires;
wherein when neither of the step S110 and the step S120 assigns an adjacent interval as a following interval and when the following criteria are satisfied, executing the corresponding step S200:
when the first time out period has expired or the step S114 is determined "yes", and, when the second time out period has expired or the step S124 is determined "yes".

3. The multi-interval sensing circuit of claim 1, wherein the interval determination step corresponding to the following interval is executed according to the following step sequences:
the step S200, followed by the step S100; or
the step S100, followed by the step S200.

4. The multi-interval sensing circuit of claim 1, wherein the hysteresis level is equal to a range corresponding to the interval.

5. The multi-interval sensing circuit of claim 1, wherein:
when the corresponding interval is a highest interval, the corresponding step S110 is be skipped; and
when the corresponding interval is a lowest interval, the corresponding step S120 is skipped.

6. The multi-interval sensing circuit of claim 1, wherein the input signal is in a voltage form.

7. The multi-interval sensing circuit of claim 2, wherein the control circuit includes: a digital filter circuit and an interval determination circuit; wherein:
the digital filter circuit includes: corresponding plural state logic circuits which are cascaded to sequentially sample and transfer the comparison result based on the sampling frequency, wherein corresponding plural state output signals of the corresponding plural state logic circuits correspond to the consecutive plural times of samplings of the comparison result; and
the interval determination circuit is configured to operably execute the interval determination step according to whether levels of the consecutive plural times of the samplings of the comparison result are consistent and/or whether a corresponding timed out period has expired.

8. The multi-interval sensing circuit of claim 7, wherein the digital filter circuit further includes:
an AND logic circuit having corresponding plural input terminals, which is configured to operably receive the state output signals of the corresponding plural state logic circuits, so as to determine whether the state output signals are all at an enabled state, thereby enabling a filtered positive signal;
wherein the interval determination circuit is configured to operably execute following operations:
the step S110 includes: when the filtered positive signal is enabled before the first time out period expires, which indicates that the input signal is higher than the corresponding ascending upper limit threshold for the consecutive plural times, assigning an adjacent interval which is relatively higher as the following interval;
the step S120 includes: when the filtered positive signal is enabled before the second time out period expires, which indicates that the input signal is lower than the corresponding descending lower limit threshold for the consecutive plural times, assigning an adjacent interval which is relatively lower as the following interval; and
wherein when neither of the corresponding filtered positive signals in the step S110 and the step S120 is enabled before the corresponding first time out period or the corresponding second time out period expires, executing the corresponding step S200.

9. The multi-interval sensing circuit of claim 8, wherein the digital filter circuit further includes:
another AND logic circuit having corresponding plural input terminals, which is configured to operably receive the state output signals of the corresponding plural state logic circuits, so as to determine whether the state output signals are all at a disabled state, thereby enabling a filtered negative signal;
wherein the interval determination circuit is configured to operably execute following operations:
the step S114 includes: determining whether the input signal is lower than the corresponding ascending upper limit threshold for the consecutive plural times before the first time out period expires according to whether the filtered negative signal is enabled before the first time out period expires; and
the step S124 includes: determining whether the input signal is higher than the corresponding descending lower limit threshold for the consecutive plural times before the second time out period expires according to whether the filtered negative signal is enabled before the second time out period expires.

10. The multi-interval sensing circuit of claim 7, wherein:
the comparison circuit includes: a comparator, configured to operably compare a reference signal with an input related signal which is correlated with the input signal, so as to generate the comparison result;
the control circuit further includes: an adjustment circuit, which is configured to operably generate a corresponding adjustment signal according to the corresponding limit threshold, wherein the adjustment signal adjusts the reference signal or the input related signal, so that a comparison between the reference signal and the input related signal corresponds to a comparison between the input signal and the corresponding limit threshold.

11. The multi-interval sensing circuit of claim 7, wherein the interval determination circuit is further configured for timing the first time out period and/or the second time out period.

12. The multi-interval sensing circuit of claim 1, wherein the interval determination step further comprises a reset step S000, wherein the reset step S000 includes:
   resetting the interval output signal; and
   executing the step S100 corresponding to an initial interval.

13. A multi-interval sensing method having multi-hysteresis, which is configured to operably sense an input signal, so as to determine an interval, among plural intervals with hysteresis, according to a level of the input signal, wherein each of the plural intervals has corresponding plural limit thresholds and a corresponding hysteresis level, wherein the plural limit thresholds includes: a corresponding ascending upper limit threshold and a corresponding descending lower limit threshold; the multi-interval sensing method comprising:
   generating a comparison result according to a comparison between the input signal and the corresponding limit threshold; and
   selecting the corresponding limit threshold and sampling the comparison result periodically based on a sampling frequency, so as to execute an interval determination step, thus generating an interval output signal, wherein the interval output signal is indicative of the corresponding interval of the input signal, wherein the interval determination step includes a step S100 and a step S200, wherein the corresponding limit threshold is selected from at least one limit threshold corresponding to the interval determination step, wherein the interval determination step includes a step S100 and a step S200, wherein:
   the step S100 includes:
      a step S110: before a first time out period expires, when the input signal is higher than the corresponding ascending upper limit threshold for consecutive plural times, assigning an adjacent interval which is relatively higher as a following interval and executing the interval determination step corresponding to the following interval;
      a step S120: before a second time out period expires, when the input signal is lower than the corresponding descending lower limit threshold for consecutive plural times, assigning an adjacent interval which is relatively lower as a following interval and executing the interval determination step corresponding to the following interval;
   wherein when neither of the step S110 and the step S120 assigns an adjacent interval as a following interval, executing the corresponding step S200;
   wherein the step S200 includes: generating the interval output signal corresponding to the interval, and, subsequently, entering into the step S100 corresponding to the interval.

14. The multi-interval sensing method of claim 13, wherein the step S110 further includes a step S114: determining whether the input signal is lower than the corresponding ascending upper limit threshold for the consecutive plural times before the first time out period expires;
   the step S120 further includes a step S124: determining whether the input signal is higher than the corresponding descending lower limit threshold for the consecutive plural times before the second time out period expires;
   wherein when neither of the step S110 and the step S120 assigns an adjacent interval as a following interval and when the following criteria are satisfied, executing the corresponding step S200:
   when the first time out period has expired or the step S114 is determined "yes", and, when the second time out period has expired or the step S124 is determined "yes".

15. The multi-interval sensing method of claim 13, wherein the interval determination step corresponding to the following interval is executed according to the following step sequences:
   the step S200, followed by the step S100; or
   the step S100, followed by the step S200.

16. The multi-interval sensing method of claim 13, wherein the hysteresis level is equal to a range corresponding to the interval.

17. The multi-interval sensing method of claim 13, wherein:
   when the corresponding interval is a highest interval, the corresponding step S110 is skipped; and
   when the corresponding interval is a lowest interval, the corresponding step S120 is skipped.

18. The multi-interval sensing method of claim 13, wherein the input signal is in a voltage form.

19. The multi-interval sensing method of claim 13, wherein the interval determination step further comprises a reset step S000, wherein the reset step S000 includes:
   resetting the interval output signal; and
   executing the step S100 corresponding to an initial interval.

* * * * *